(12) United States Patent
Omura

(10) Patent No.: US 7,936,441 B2
(45) Date of Patent: May 3, 2011

(54) PROJECTION OPTICAL SYSTEM, EXPOSURE APPARATUS, AND EXPOSURE METHOD

(75) Inventor: Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 686 days.

(21) Appl. No.: 11/920,331

(22) PCT Filed: May 8, 2006

(86) PCT No.: PCT/JP2006/309253
§ 371 (c)(1), (2), (4) Date: Nov. 9, 2007

(87) PCT Pub. No.: WO2006/121008
PCT Pub. Date: Nov. 16, 2006

(65) Prior Publication Data
US 2009/0092925 A1      Apr. 9, 2009

(30) Foreign Application Priority Data

May 12, 2005   (JP) .................. 2005-139343

(51) Int. Cl.
| B60R 1/06 | (2006.01) |
| G02B 7/02 | (2006.01) |
| G03B 27/42 | (2006.01) |
| G03B 27/52 | (2006.01) |
| G03B 27/54 | (2006.01) |

(52) U.S. Cl. .............. 355/30; 355/53; 355/67; 359/507; 359/819

(58) Field of Classification Search .......... 355/30, 355/53, 67, 77; 359/507, 513, 809, 811, 359/830, 818–819; 250/492.2
See application file for complete search history.

(56) References Cited

U.S. PATENT DOCUMENTS

| 4,886,342 A | 12/1989 | Kudo et al. |
| 5,995,304 A | 11/1999 | Nomura et al. |
| 6,671,246 B1 | 12/2003 | Matsuo |
| 2002/0021503 A1 | 2/2002 | Osterried |

(Continued)

FOREIGN PATENT DOCUMENTS

JP          60230604       11/1985

(Continued)

OTHER PUBLICATIONS

International Search Report, dated Aug. 8, 2006, for corresponding International Application No. PCT/JP2006/309253, filed May 8, 2006.

(Continued)

*Primary Examiner* — Hung Henry Nguyen
*Assistant Examiner* — Colin Kreutzer
(74) *Attorney, Agent, or Firm* — Klarquist Sparkman, LLP

(57) ABSTRACT

An immersion projection optical system that prevents leakage of a liquid (immersion liquid) into the optical system and maintains satisfactory imaging capability. The projection optical system of the present invention is a projection optical system that projects a reduced image of a first plane onto a second plane through a liquid. The projection optical system includes an interface optical lens (Lb) having a side towards the first plane that contacts a gas and a side towards the second plane that contacts the liquid. The interface optical element includes a light entering surface (Lba), which has a convex shape facing towards the first plane, and a groove (Gr), which is formed to surround an effective region in a light emitting surface of the interface optical element.

19 Claims, 10 Drawing Sheets

U.S. PATENT DOCUMENTS

| | | | |
|---|---|---|---|
| 2002/0027863 A1 | 3/2002 | Kikuchi et al. | |
| 2005/0185269 A1* | 8/2005 | Epple et al. | 359/366 |
| 2005/0232120 A1 | 10/2005 | Shinoda | |
| 2005/0259234 A1* | 11/2005 | Hirukawa et al. | 355/53 |
| 2006/0077788 A1 | 4/2006 | Shinoda | |
| 2006/0077789 A1 | 4/2006 | Shinoda et al. | |
| 2006/0164616 A1 | 7/2006 | Okada | |
| 2006/0203218 A1 | 9/2006 | Shirai et al. | |
| 2006/0209278 A1 | 9/2006 | Kiuchi et al. | |
| 2006/0291060 A1* | 12/2006 | Shirai et al. | 359/582 |
| 2007/0103661 A1 | 5/2007 | Nishii | |
| 2008/0106711 A1* | 5/2008 | Beierl et al. | 355/30 |
| 2008/0291408 A1* | 11/2008 | Nagasaka | 355/30 |
| 2009/0103062 A1* | 4/2009 | Van De Kerkhof et al. | 355/30 |

FOREIGN PATENT DOCUMENTS

| | | |
|---|---|---|
| JP | 10-303114 | 11/1998 |
| JP | 2003-075703 | 3/2003 |
| JP | 2004-205698 | 7/2004 |
| JP | 2005-005395 | 1/2005 |
| JP | 2005-116570 | 4/2005 |
| JP | 2006-019720 | 1/2006 |
| JP | 2006-128192 | 5/2006 |
| JP | 2006-268741 | 10/2006 |
| WO | WO 99/49504 | 9/1999 |
| WO | WO 2004/019128 | 3/2004 |
| WO | WO 2005/020298 | 8/2004 |
| WO | WO 2005006417 | 1/2005 |
| WO | WO 2005031823 | 4/2005 |
| WO | WO 2005/119742 | 6/2005 |

OTHER PUBLICATIONS

European Search Report, dated May 3, 2010, issued in Corresponding European Application No. 06746084.

International Preliminary Report on Patentability, dated Nov. 13, 2007, for corresponding PCT/JP2006/309253, filed May 8, 2006.

* cited by examiner

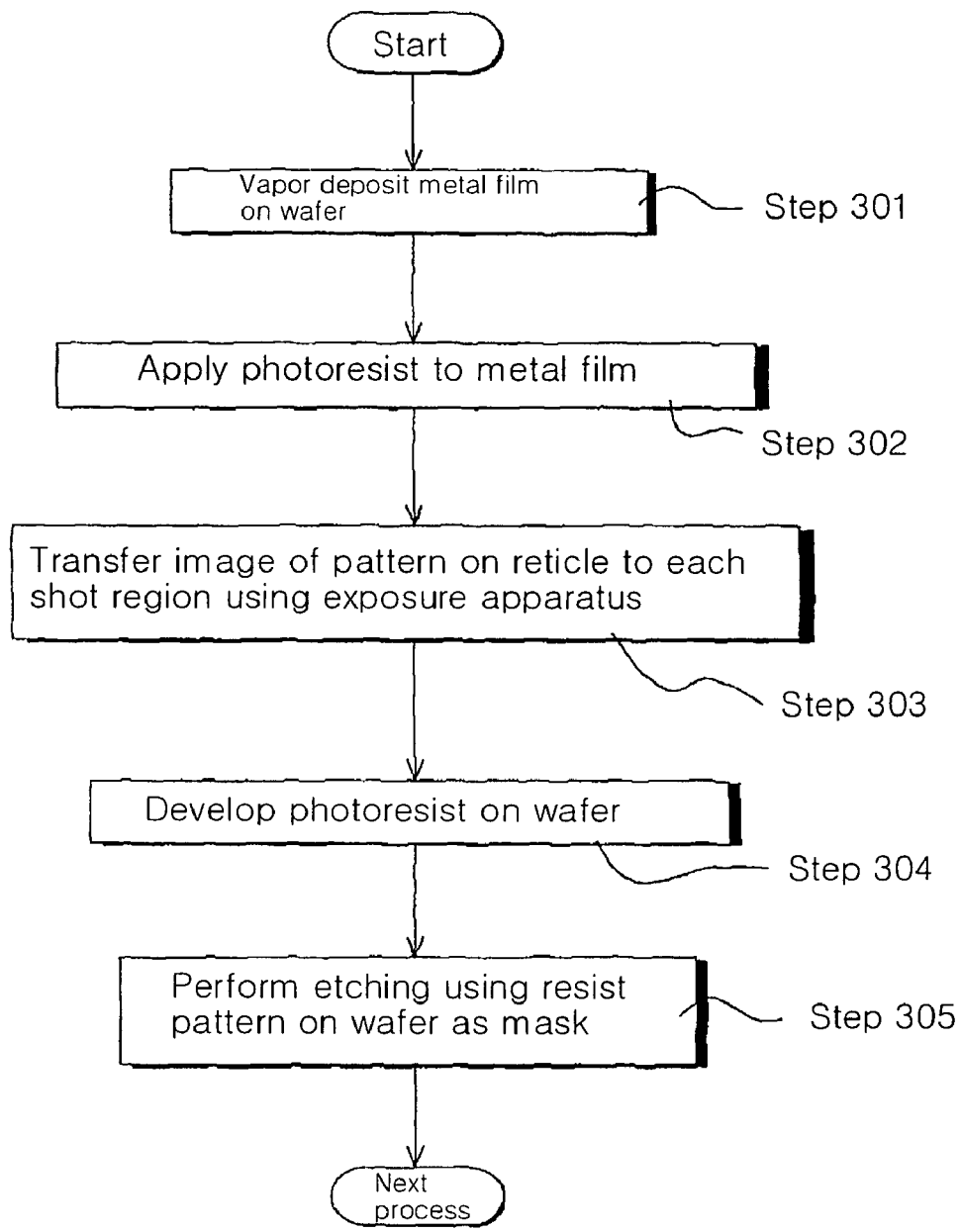

PROJECTION OPTICAL SYSTEM, EXPOSURE APPARATUS, AND EXPOSURE METHOD

CROSS REFERENCE TO RELATED APPLICATIONS

This application is a U.S. national-phase application (35 U.S.C. §371) of, claims priority to, and claims the benefit of International Application No. PCT/JP2006/309253, filed on May 8, 2006, which is incorporated herein by reference in its entirety, and which claims priority to and the benefit of Japan Patent Application No. 2005-139343, filed on May 12, 2005.

TECHNICAL FIELD

The present invention relates to a projection optical system, an exposure apparatus, and an exposure method, and more particularly, to a projection optical system optimal for an exposure apparatus used to manufacture microdevices, such as semiconductor devices and liquid crystal display devices, through a photolithography process.

BACKGROUND ART

An exposure apparatus projects and exposes an image of a pattern of a mask (or a reticle) on a photosensitive substrate (e.g., wafer or a glass plate coated by a photoresist). More specifically, the exposure apparatus uses a projection optical system to project and expose the image in a photolithography process, in which semiconductor devices or the like are manufactured. The projection optical system is required to have a higher resolution due to the increasing level of integration of semiconductor devices or the like manufactured with the exposure apparatus.

To improve the resolution of the projection optical system, the projection optical system needs to shorten the wavelength $\lambda$ of its illumination light (exposure light) and increase the numerical aperture NA at its image side. The resolution of the projection optical system is written as $k*\lambda/NA$ (where k is a process coefficient). The image-side numerical aperture NA is written as $n*\sin\theta$, where n is the refractive index of a medium (usually gas, such as air) that arranged between the projection optical system and the photosensitive substrate, and $\theta$ is the maximum incident angle at which light enters the photosensitive substrate.

When the maximum angle $\theta$ is set larger in an effort to increase the image-side numerical aperture, the angle at which light is emitted from the projection optical system and the angle at which the light enters the photosensitive substrate increase. This increases reflection loss occurring at an optical surface. As a result, the projection optical system cannot obtain a large effective numerical aperture at its image side. One conventional technique for increasing the image-side numerical aperture is an immersion technique (refer to, for example, Patent Document 1), with which an optical path formed between a projection optical system and a photosensitive substrate is filled with a medium such as a liquid having a high refractive index.

Patent Document 1: International Patent Publication No. WO2004/019128

DISCLOSURE OF THE INVENTION

Problems to be Solved by the Invention

However, when setting an image-side numerical aperture of an immersion projection optical system to be greater than 1.2, a light entering surface of an interface lens (interface optical element), of which the light entering side contacts gas and the light emitting side contacts liquid, must have a convex surface shape having a large curvature and projected toward the light entering side to avoid reflection of the incident light. In this case, a holding tab for holding the interface lens is inevitably located near the liquid, and the liquid is apt to easily leak into the projection optical system. Leakage of liquid into the projection optical system results in deterioration of an anti-reflection film on the optical surface, which, in turn, may increase the risk of the imaging capability (generally, the optical capability) of the projection optical system being lowered.

Accordingly, it is an object of the present invention to prevent leakage of liquid (immersion liquid) into the optical system in order to maintain a satisfactory imaging capability. A further object of the present invention is to provide an exposure apparatus and an exposure method for projecting and exposing a micropattern highly accurately and stably using a high resolution immersion projection optical system that prevents leakage of liquid (immersion liquid) into the optical system in order to maintain a satisfactory imaging capability.

Means of Solving the Problems

To achieve the above object, a first aspect of the present invention provides a projection optical system for projecting an image of a first plane onto a second plane through a liquid. The projection optical system includes an interface optical element including a side towards the first plane that contacts a gas and a side towards the second plane that contacts the liquid. The interface optical element includes a light entering surface, which has a convex shape facing towards the first plane, and a groove, which is formed to surround an effective region in a light emitting surface of the interface optical element.

A second aspect of the present invention provides a projection optical system for projecting an image of a first plane onto a second plane through a liquid. The projection optical system includes an interface optical element including a side towards the first plane that contacts a gas and a side towards the second plane that contacts the liquid. The interface optical element includes a light entering surface, which has a convex shape facing towards the first plane, and a holding tab, which is arranged on a holding plane orthogonal to an optical axis, with the holding tab and the optical axis forming a space therebetween.

A third aspect of the present invention provides an exposure apparatus including an illumination system for illuminating a pattern set on the first plane, and the projection optical system of the first aspect or the second aspect for projecting an image of the pattern onto a photosensitive substrate set on the second plane.

A fourth aspect of the present invention provides an exposure method including an illuminating step of illuminating a pattern set on the first plane, and an exposure step of projecting and exposing an image of the pattern onto a photosensitive substrate set on the second plane with the projection optical system of the first aspect for the second aspect.

A fifth aspect of the present invention provides a device manufacturing method including an exposure step of projecting and exposing an image of a pattern set on the first plane onto a photosensitive substrate set on the second plane with the projection optical system according to the first aspect or the second aspect, and a development step of developing the photosensitive substrate that has undergone the exposure step.

A sixth aspect of the present invention provides an optical element for use in an immersion objective optical system and having one optical surface that contacts liquid. The optical element includes another optical surface of the optical element having a convex shape, and a groove formed to surround an effective region in the one optical surface.

A seventh aspect of the present invention provides an optical element for use in an immersion objective optical system and having one optical surface that contacts liquid and another optical surface having a convex shape. The optical element includes a holding tab for holding the optical element, wherein the holding tab is arranged on a holding plane orthogonal to an optical axis of the optical element, wherein a space is formed between the holding tab and the optical axis.

An eighth aspect of the present invention provides an immersion objective optical system including the optical element of the sixth aspect or the seventh aspect. The optical element is arranged nearest to a liquid side.

Effect of the Invention

In an immersion projection optical system according to a typical aspect of the present invention, a holding tab for an interface optical element (interface lens) is located near liquid at the light emitting surface side. However, a groove is formed so as to surround an effective region of a light emitting surface of the interface optical element. Thus, the groove functions to resist leakage of liquid into the space between the holding tab and the lens cell, thus making it difficult for liquid to leak into the projection optical system.

In other words, in the projection optical system of the present invention, leakage of liquid (immersion liquid) into the optical system is prevented, and satisfactory imaging capability is maintained. In the exposure apparatus and exposure method of the present invention, a high resolution immersion projection optical system that prevents leakage of liquid into the optical system and maintains satisfactory imaging capability is used. Thus, fine patterns are stably projected and exposed with high accuracy, and satisfactory microdevices are stably manufactured with high accuracy.

BRIEF DESCRIPTION OF THE DRAWINGS

FIG. 10 is a flowchart showing a method for forming a microdevice, which serves as a semiconductor device.

Figure 1:
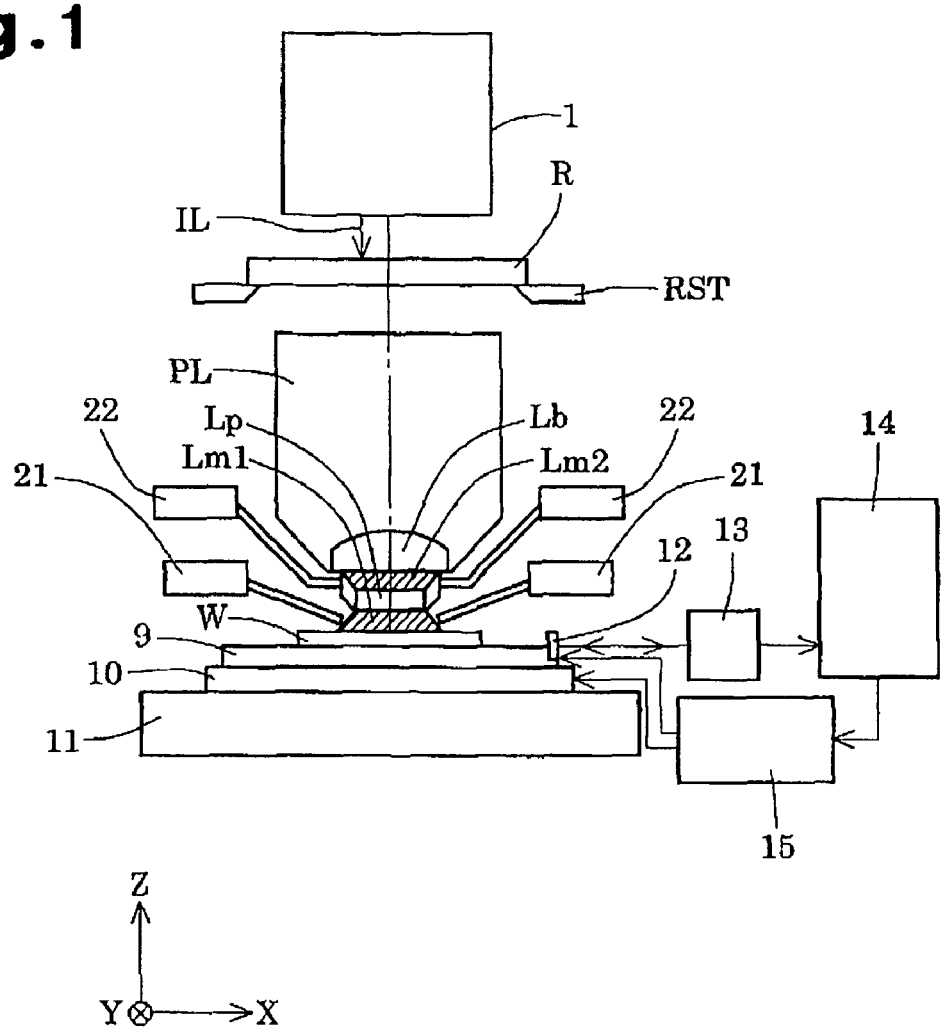
FIG. 1 is a schematic diagram showing the structure of an exposure apparatus according to a present embodiment of the present invention.

| DESCRIPTION OF REFERENCE NUMERALS | |
|---|---|
| R | reticle |
| RST | reticle stage |
| PL | projection optical system |
| Lp | interface lens |
| Lp | immersed plane parallel plate |
| Lm1, Lm2 | pure water (liquid) |
| W | wafer |
| 1 | illumination optical system |
| 9 | Z-stage |
| 10 | XY-stage |
| 12 | movable mirror |
| 13 | wafer laser interferometer |
| 14 | main control system |
| 15 | wafer stage drive system |
| 21 | first supply and discharge mechanism |
| 22 | second supply and discharge mechanism |

BEST MODE FOR CARRYING OUT THE INVENTION

An embodiment of the present invention will now be described with reference to the drawings. FIG. 1 is a schematic diagram showing the structure of an exposure apparatus of the present embodiment of the present invention. In FIG. 1, X-axis and Y-axis are directions parallel to a wafer W, whereas Z-axis is a direction perpendicular to the wafer W. More specifically, the XY surface is parallel to the horizontal surface, and +Z-axis is oriented upward in the vertical direction.

The exposure apparatus of the present embodiment includes an ArF excimer laser light source, which functions for example as an exposure light source, and an illumination optical system 1 as shown in FIG. 1. The illumination optical system 1 includes an optical integrator (homogenizer), a field stop, and a condenser lens. Exposure light (an exposure beam) IL, which is ultraviolet pulsed light having a wavelength of 193 nm, is emitted from the light source, passes through the illumination optical system 1, and illuminates a reticle (mask) R. The reticle R has a pattern that is to be transferred. The entire pattern region on the reticle R includes a rectangular (slit) pattern region of which long sides extend in X-axis direction and of which short sides extend in the Y-axis direction. The exposure beam IL illuminates the rectangular pattern region on the reticle R.

Light that has passed through the reticle R enters an immersion projection optical system PL. The projection optical system PL projects the reticle pattern with a predetermined reduction ratio onto the wafer (photosensitive substrate) W that is coated with a photoresist. The projection optical system PL forms an image of the reticle pattern on the wafer W. More specifically, the projection optical system PL forms the pattern image on a rectangular stationary exposure region (effective exposure region) of which long sides extend in the X-axis direction and of which short sides extend in the Y-axis direction on the wafer W, which optically corresponds to the rectangular illumination region formed on the reticle R.

Figure 2:
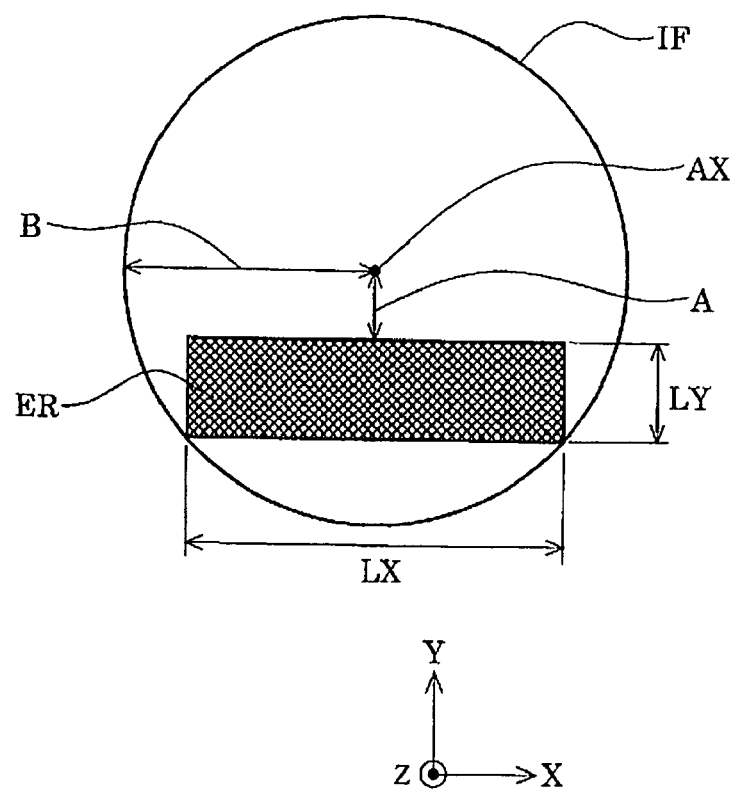
FIG. 2 shows the positional relationship between a rectangular stationary exposure region formed on a wafer and a reference optical axis in the present embodiment of the present embodiment.

FIG. 2 shows the positional relationship between the rectangular stationary exposure region (effective exposure region) that is formed on the wafer and a reference optical axis in the present embodiment. In the present embodiment, as shown in FIG. 2, the rectangular effective exposure region ER having a predetermined size is defined at a position distant from the reference optical axis AX in the Y-axis direction by an off-axis amount A within a circular region (image circle) IF. The center of the image circle IF coincides with the reference optical axis AX. The image circle IF has a radius B.

The effective exposure region ER has a length LX in the X-axis direction and a length LY in the Y-axis direction. Although not shown in the drawing, the rectangular illumination region (effective illumination region) corresponding to the rectangular effective exposure region ER is formed on the reticle R. More specifically, a rectangular illumination region having a size and shape corresponding to the effective exposure region ER is formed on the reticle R at a position distant from the reference optical axis AX in the Y-axis direction by the off-axis amount A.

A reticle stage RST supports the reticle R in such a manner that the reticle R is parallel to the XY surface. The reticle stage RST incorporates a mechanism for slightly moving the reticle R in the X-axis direction, the Y-axis direction, and a rotation direction. The positions of the reticle stage RST in the X-axis direction, the Y-axis direction, and the rotation direction are measured and controlled in real time by a reticle laser interferometer (not shown). A wafer holder (not shown) fixes the wafer W to a Z-stage 9 in a manner that the wafer W is parallel to the XY surface.

The Z-stage 9 is fixed to an XY-stage 10. The XY-stage 10 moves along the XY surface, which is substantially parallel to an image surface of the projection optical system PL. The Z-stage 9 controls the focus position (Z-axis position) and the tilt angle of the wafer W. The positions of the Z-stage 9 in the X-axis direction, the Y-axis direction, and the rotation direction are measured and controlled in real time by a wafer laser interferometer 13. The wafer laser interferometer 13 uses a movable mirror 12, which is arranged on the Z-stage 9.

The XY-stage 10 is mounted on a base 11. The XY-stage 10 controls the positions of the wafer W in the X-axis direction, the Y-axis direction, and the rotation direction. A main control system 14, which is mounted on the exposure apparatus of the present embodiment, adjusts the positions of the reticle R in the X-axis direction, the Y-axis direction, and the rotation direction based on the values measured by the reticle laser interferometer. More specifically, the main control system 14 transmits a control signal to mechanisms incorporated in the reticle stage RST, and positions the reticle R by slightly moving the reticle stage RST.

The main control system 14 adjusts the focus position (Z-axis position) and the tilt angle of the wafer W to align the surface of the wafer W to the image surface of the projection optical system PL through autofocusing and automatic leveling. More specifically, the main control system 14 transmits a control signal to a wafer stage drive system 15 and drives the Z-stage 9 using the wafer stage drive system 15 to adjust the focus position and the tilt angle of the wafer W.

The main control system 14 further adjusts the positions of the wafer W in the X-axis direction, the Y-axis direction, and the rotation direction based on the values measured by the wafer laser interferometer 13. More specifically, the main control system 14 transmits a control signal to the wafer stage drive system 15, and adjusts the positions of the wafer W in the X-axis direction, the Y-axis direction, and the rotation direction by driving the XY stage 10 using the wafer stage drive system 15.

During exposure, the main control system 14 transmits a control signal to mechanisms incorporated in the reticle stage RST and also transmits a control signal to the wafer stage drive system 15. This drives the reticle stage RST and the XY-stage 10 at a speed ratio determined by the projection magnitude of the projection optical system PL, while the pattern image of the reticle R is projected and exposed within a predetermined shot region formed on the wafer W. Afterwards, the main control system 14 transmits a control signal to the wafer stage drive system 15, and drives the XY-stage 10 using the wafer stage drive system 15 to cause a step movement of the exposure position to another shot region formed on the wafer W.

The pattern image of the reticle R is repeatedly scanned and exposed on the wafer W with the step-and-scan method as described above. More specifically, the reticle stage RST and the XY-stage 10 and consequently the reticle R and the wafer W are moved (scanned) in synchronization in the short-side direction of the rectangular stationary exposure region and the stationary illumination region, or the Y-axis direction, while the positions of the reticle R and the wafer W are adjusted using the wafer stage drive system 15 and the wafer laser interferometer 13 or the like. Through this operation, the reticle pattern is scanned and exposed in the region on the wafer W that has the same length as the length of the long side LX of the stationary exposure region and has the same width as the width corresponding to the scanning amount (moving amount) of the wafer W.

Figure 3:
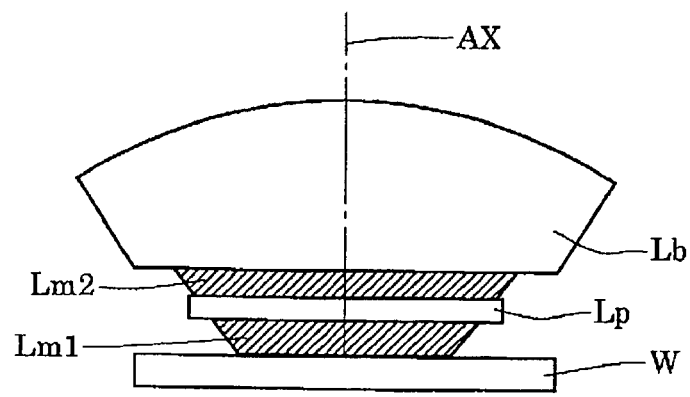
FIG. 3 is a schematic diagram showing the structure of an interface lens and a wafer in examples of the present embodiment.

FIG. 3 is a schematic diagram showing the structure of an interface lens and a wafer in examples of the present embodiment. As shown in FIG. 3, an immersed plane parallel plate Lp is arranged nearest to the wafer W in the projection optical system PL in each example of the present embodiment. One surface of the immersed plane parallel plate Lp nearer to the reticle R (object side surface) is in contact with a second liquid Lm2, and another surface of the immersed plane parallel plate Lp nearer to the wafer W (image side surface) is in contact with a first liquid Lm1. An interface lens Lb is arranged adjacent to the immersed plane parallel plate Lp. One surface of the interface lens Lb nearer to the reticle R (reticle side surface) is in contact with gas, and another surface of the interface lens Lb nearer to the wafer W (wafer side surface) is in contact with the second liquid Lm2.

The projection optical system PL of each example of the present invention uses pure water (deionized water) as the first liquid Lm1 and the second liquid Lm2, which have a reflective index greater than 1.1. Pure water is easily obtained in large amounts at, for example, a semiconductor manufacturing factory. The projection optical system PL of each example uses, as the interface lens Lb, a positive lens that has a convex surface at the reticle side and a planar surface as the wafer side. The interface lens Lb and the immersed plane parallel plate Lp are both made of silica. Silica is selected as the material for the interface lens Lb and the immersed plane parallel plate Lp because the projection optical system PL may fail to maintain stable imaging performance when, for example, the interface lens Lb and/or the immersed plane parallel plate Lp are made of fluorite, which is soluble in water.

Further, the internal refractive index distribution of fluorite is known to contain a high-frequency element. The uneven refractive indexes of fluorite including the high-frequency element may cause flares. This may easily lower the imaging performance of the projection optical system. Moreover, fluorite is known to have natural birefringence. The natural birefringence effect of fluorite needs to be corrected to achieve high imaging performance of the projection optical system. The solubility, high-frequency element in the refractive index distribution, and natural birefringence make fluorite unsuitable for the material for the interface lens Lb and the immersed plane parallel plate Lp. It is preferable that the interface lens Lb and the immersed plane parallel plate Lp be made of silica.

The exposure apparatus that performs scanning and exposure while moving the wafer W relative to the projection optical system PL with the step-and-scan method needs to continuously fill the optical path between the interface lens Lb and the wafer W of the projection optical system PL with the liquid (Lm1 and Lm2) from the start to the end of the scanning and exposure process. To enable this, the exposure apparatus may use a technique described for example in International Patent Publication No. WO99/49504 or a technique described for example in Japanese Laid-Open Patent Publication No. 10-303114.

According to the technique described in International Patent Publication No. WO99/49504, a liquid supply apparatus supplies liquid, which has been adjusted to a predetermined temperature, to fill the optical path between the interface lens Lb and the wafer W through a supply pipe and an ejection nozzle, and then recovers the liquid on the wafer W through a recovery pipe and a suction nozzle. According to the technique described in Japanese Laid-Open Patent Publication No. 10-303114, a wafer holder table functions as a container for accommodating liquid. The wafer W is positioned and supported at the center of an inner bottom surface of the wafer holder table (immersed in the liquid) by vacuum contact. A distal end of a barrel of the projection optical system PL is immersed in the liquid. A wafer-side optical surface of the interface lens Lb is immersed in the liquid.

As shown in FIG. 1, the projection optical system PL of the present embodiment uses a first supply and discharge mechanism 21 to circulate pure water, which functions as the first liquid Lm1, in the optical path between the immersed plane parallel plate Lp and the wafer W. The projection optical system PL also uses a second supply and discharge mechanism 22 to circulate pure water, which functions as the second liquid Lm2, in the optical path between the interface lens Lb and the immersed plane parallel plate Lp. In this manner, the projection optical system PL circulates a small amount of pure water as the immersion liquid to prevent corrosion or fungal deterioration of the liquid.

In the examples of the present invention, an aspherical surface can be written as expression (a) shown below. In expression (a), y represents the height in the direction vertical to the optical axis, z represents the distance (sag amount) between a tangent plane at the vertex of the aspherical surface and the position at the height y on the aspherical surface, r represents the curvature radius of the vertex, k represents the coefficient of the cone, and $C_n$ represents the n-th degree aspherical coefficient. In tables 1 and 2, which are shown below, the surface number of each aspherical lens surface is marked with *.

$$z=(y^2/r)/[1+\{1-(1+k)*y^2/r^2\}^{1/2}]+C_4*y^4+C_6*y^6+C_8*y^8+C_{10}*y^{10}+C_{12}*y^{12}+C_{14}*y^{14}+\ldots \quad \text{Expression (a)}$$

The projection optical system PL of each example of the present embodiment includes a first imaging optical system G1, a second imaging optical system G2, and a third imaging optical system G3. The first imaging optical system G1 forms a first intermediate image of a pattern of the reticle R, which is arranged on an object plane (first plane) of the projection optical system PL. The second imaging optical system G2 forms a second intermediate image (which is an image of the first intermediate image as well as a secondary image of the reticle pattern) of the reticle pattern based on the light from the first intermediate image. The third imaging optical system G3 forms a final image (which is a reduced image of the reticle pattern) on the wafer W, which is arranged on an image plane (second plane) of the projection optical system PL, based on light from the second intermediate image. The first imaging optical system G1 and the third imaging optical system G3 are both refractive optical systems. The second imaging optical system G2 is a catadioptric optical system that includes a concave reflective mirror CM.

A first planar reflective mirror (first folding mirror) M1 is arranged in an optical path formed between the first imaging optical system G1 and the second imaging optical system G2. A second planar reflective mirror (second folding mirror) M2 is arranged in an optical path formed between the second imaging optical system G2 and the third imaging optical system G3. In the projection optical system PL of each example of the present invention, light from the reticle R passes through the first imaging optical system G1 and forms a first intermediate image of the reticle pattern in the vicinity of the first planar reflective mirror M1. Light from the first intermediate image then passes through the second imaging optical system G2 and forms a second intermediate image of the reticle pattern in the vicinity of the second planar reflective mirror M2. Finally, light from the second intermediate image passes through the third imaging optical system G3, and forms a final image of the reticle pattern on the wafer W.

In the projection optical system PL of each example of the present invention, the first imaging optical system G1 has an optical axis AX1 and the third imaging optical system G3 has an optical axis AX3. The optical axes AX1 and AX3 extend linearly in the vertical direction. The optical axes AX1 and AX3 coincide with the reference optical axis AX. The second imaging optical system G2 has an optical axis AX2 that extends linearly along the horizontal direction (vertical to the reference optical axis AX). The reticle R, the wafer W, all the optical members forming the first imaging optical system G1, and all the optical members forming the third imaging optical system G3 are arranged parallel to one another along planes perpendicular to the direction of gravitational force, that is, along horizontal planes. Further, the first planar reflective mirror M1 and the second planar reflective mirror M2 have reflective surfaces that each form an angle of 45 degrees with the reticle surface. The first planar reflective mirror M1 and the second planar reflective mirror M2 are formed integrally as a single optical member. Further, the projection optical system PL of each example of the present invention is formed to be substantially telecentric at both of the object side and the image side.

FIRST EXAMPLE

Figure 4:
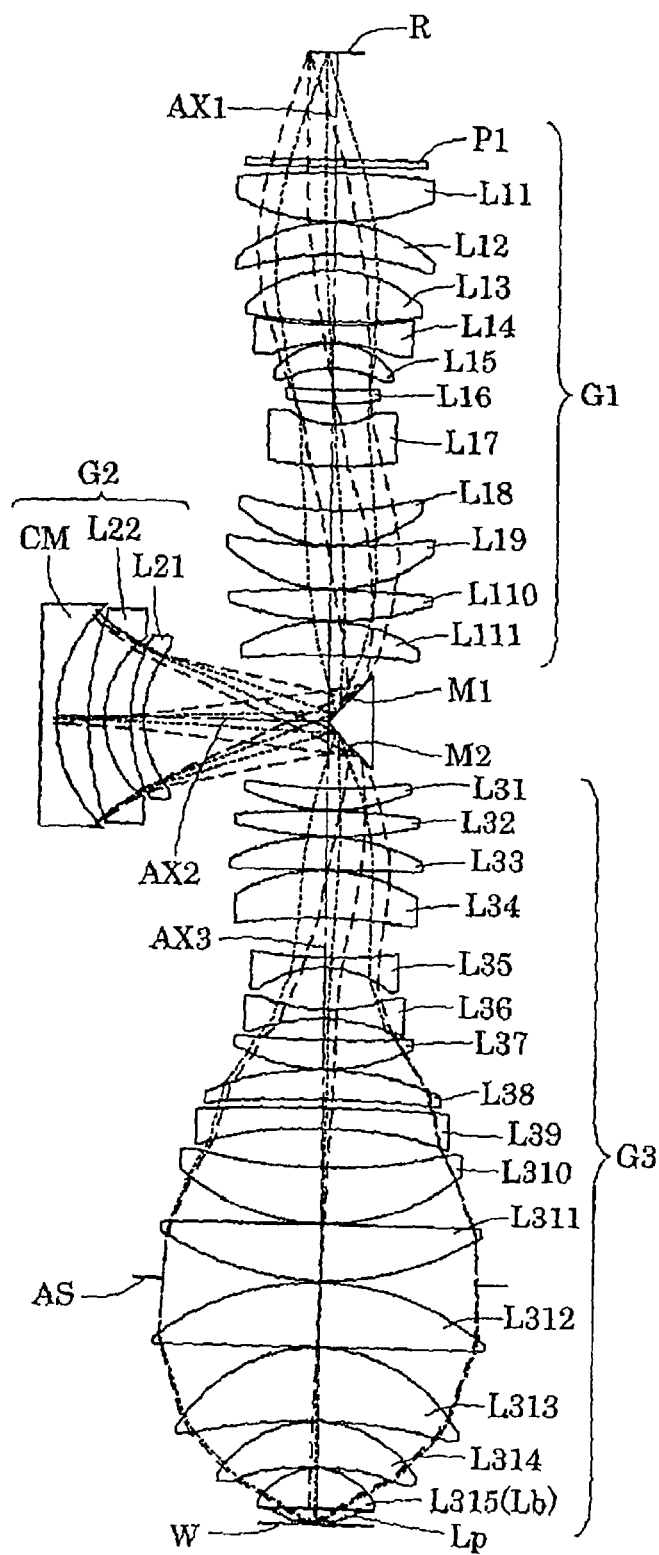
FIG. 4 shows a lens structure of a projection optical system in a first example of the present embodiment.

FIG. 4 shows a lens structure of a projection optical system according to a first example of the present embodiment. As shown in FIG. 4, the first imaging optical system G1 included in the projection optical system PL of the first example includes a plane parallel plate P1, a biconvex lens L11, a positive meniscus lens L12 having a convex surface at its reticle side, an biconvex lens L13, a biconcave lens L14 having a aspherical concave surface at its reticle side, a positive meniscus lens L15 having a convex surface at its reticle side, a positive meniscus lens L16 having a concave surface at its reticle side, a negative meniscus lens L17 having a concave surface at its reticle side, a positive meniscus lens L18 having an aspherical concave surface at its reticle side, a positive meniscus lens L19 having a concave surface at its reticle side, a biconvex lens L110, and a positive meniscus lens L111 having an aspherical concave surface at its wafer side, which are arranged sequentially in this order from the reticle side.

The second imaging optical system G2 includes a negative meniscus lens L21 having a concave surface at its reticle side, a negative meniscus lens L22 having a concave surface at its reticle side, and a concave reflective mirror CM having a concave surface at its reticle side, which are arranged sequentially in this order along the traveling path of the incoming light from the reticle side (light entering side) of the projection optical system PL. The third imaging optical system G3 includes a positive meniscus lens L31 having a concave surface at its reticle side, a biconvex lens L32, a positive meniscus lens L33 having a convex surface at its reticle side, a positive meniscus lens L34 having a spherical concave surface at its wafer side, a biconcave lens L35, a biconcave lens L36 having an aspherical concave surface at its wafer side, a positive meniscus lens L37 having an aspherical concave surface at its reticle side, a positive meniscus lens L38 having an aspherical concave surface at its wafer side, a negative meniscus lens L39 having a aspherical concave surface at its wafer side, a positive meniscus lens L310 having an aspherical concave surface at its reticle side, a biconvex lens L311, an aperture stop AS, a plano-convex lens L312 having a planar surface at its wafer side, a positive meniscus lens L313 having an aspherical concave surface at its wafer side, a positive meniscus lens S314 having an aspherical concave surface at its wafer side, a plano-convex lens L315 (interface lens Lb) having a planar surface at its wafer side, and a plane parallel plate Lp, which are arranged sequentially in this order from the reticle side (light entering side).

In the projection optical system PL of the first example, an optical path between the interface lens Lb and the plane parallel plate (immersed plane parallel plate) Lp and an optical path between the plane parallel plate Lp and the wafer W are filled with pure water (Lm1 and Lm2) having a refractive index of 1.435876 for an ArF excimer laser beam (having a central wavelength λ of 193.306 nm), which is the used light (exposure beam). All the light transmitting members including the interface lens Lb and the plane parallel plate Lp are made of silica ($SiO_2$), which has a refractive index of 1.5603261 relative to the central wavelength of the used light.

Table 1 below shows the specifications of the projection optical system PL in the first example. In Table 1, λ represents the central wavelength of the exposure beam, β represents the projection magnification (imaging ratio of the entire system), NA represents the numerical aperture at the image side (wafer side) of the system, B represents the radius of the image circle IF on the wafer W, A represents the off-axis amount of the effective exposure region ER, LX represents the size of the effective exposure region ER in the X-axis direction (the long-side dimension of the effective exposure region ER), and LY represents the dimension of the effective exposure region ER in the Y-axis direction (the short-side dimension of the effective exposure region ER).

In the table, the surface number represents the order of each surface on the path of the light traveling from the reticle surface, which is the object surface (first plane), to the wafer surface, which is the image surface (second plane), r represents the curvature radius of each surface (the curvature radius (mm) of the vertex in the case of an aspherical surface), d represents the axial interval of each surface or the surface interval (mm), and n represents the refractive index about the central wavelength of the exposure beam. The sign of the surface interval d is inverted whenever the light is reflected. Accordingly, the surface interval d has a negative sign for the optical path from the reflective surface of the first planar reflective mirror M1 to the concave reflective mirror CM and for the optical path from the second planar reflective mirror M2 to the image surface, whereas the surface interval d has a positive sign for other optical paths.

In the first imaging optical system G1, the curvature radius is positive for convex surfaces facing toward the reticle side, and the curvature radius is negative for concave surfaces facing toward the reticle side. In the second imaging optical system G2, the curvature radius is positive for concave surfaces facing toward the light entering side (reticle side) of the incoming light, and the curvature radius is negative for convex surfaces facing toward the light entering side. The notations used in Table 1 are used in Table 2, which will be described later.

TABLE 1

(Main Specifications)

λ = 193.306 nm
β = ¼
NA = 1.32
B = 15.3 mm
A = 2.8 mm
LX = 26 mm
LY = 5 mm (Specifications of Optical Members)

| Surface No. | r | d | n | Optical Member |
|---|---|---|---|---|
| | (Reticle Surface) | 113.7542 | | |
| 1 | ∞ | 8.0000 | 1.5603261 | (P1) |
| 2 | ∞ | 6.0000 | | |
| 3 | 961.49971 | 52.0000 | 1.5603261 | (L11) |
| 4 | −260.97642 | 1.0000 | | |
| 5 | 165.65618 | 35.7731 | 1.5603261 | (L12) |
| 6 | 329.41285 | 15.7479 | | |
| 7 | 144.73700 | 56.4880 | 1.5603261 | (L13) |
| 8 | −651.17229 | 4.1450 | | |
| 9* | −678.61021 | 18.2979 | 1.5603261 | (L14) |
| 10 | 173.73534 | 1.0000 | | |
| 11 | 82.85141 | 28.4319 | 1.5603261 | (L15) |
| 12 | 122.17403 | 24.6508 | | |
| 13 | −632.23083 | 15.8135 | 1.5603261 | (L16) |
| 14 | −283.76586 | 22.9854 | | |
| 15 | −95.83749 | 44.8780 | 1.5603261 | (L17) |
| 16 | −480.25701 | 49.9532 | | |
| 17* | −327.24655 | 37.6724 | 1.5603261 | (L18) |
| 18 | −152.74838 | 1.0000 | | |
| 19 | −645.51205 | 47.0083 | 1.5603261 | (L19) |
| 20 | −172.70890 | 1.0000 | | |
| 21 | 1482.42136 | 32.7478 | 1.5603261 | (L110) |
| 22 | −361.68453 | 1.0000 | | |
| 23 | 185.06735 | 36.2895 | 1.5603261 | (L111) |
| 24* | 1499.92500 | 72.0000 | | |
| 25 | ∞ | −204.3065 | | (M1) |
| 26 | 115.50235 | −15.0000 | 1.5603261 | (L21) |
| 27 | 181.35110 | −28.1819 | | |
| 28 | 107.57500 | −18.0000 | 1.5603261 | (L22) |
| 29 | 327.79447 | −34.9832 | | |
| 30 | 165.18700 | 34.9832 | | (CM) |
| 31 | 327.79446 | 18.0000 | 1.5603261 | (L22) |
| 32 | 107.57500 | 28.1819 | | |
| 33 | 181.35110 | 15.0000 | 1.5603261 | (L21) |
| 34 | 115.50235 | 204.3065 | | |
| 35 | ∞ | −72.0000 | | (M2) |
| 36 | 552.89298 | −24.4934 | 1.5603261 | (L31) |
| 37 | 211.40931 | −1.0000 | | |
| 38 | −964.15750 | −27.5799 | 1.5603261 | (L32) |
| 39 | 451.41200 | −1.0000 | | |
| 40 | −239.74429 | −35.7714 | 1.5603261 | (L33) |
| 41 | −171769.23040 | −1.0000 | | |
| 42 | −206.94777 | −50.0000 | 1.5603261 | (L34) |
| 43* | −698.47035 | −43.1987 | | |

TABLE 1-continued

| | | | | |
|---|---|---|---|---|
| 44 | 560.33453 | −10.0000 | 1.5603261 | (L35) |
| 45 | −116.92245 | −46.5360 | | |
| 46 | 209.32811 | −10.0000 | 1.5603261 | (L36) |
| 47* | −189.99848 | −23.6644 | | |
| 48* | 1878.63986 | −31.5066 | 1.5603261 | (L37) |
| 49 | 211.85278 | −1.0000 | | |
| 50 | −322.20466 | −33.1856 | 1.5603261 | (L38) |
| 51* | −1160.22740 | −10.0172 | | |
| 52 | −2715.10365 | −22.0000 | 1.5603261 | (L39) |
| 53* | −959.87714 | −42.0799 | | |
| 54* | 727.37853 | −62.0255 | 1.5603261 | (L310) |
| 55 | 240.59248 | −1.0000 | | |
| 56 | −16276.86134 | −62.1328 | 1.5603261 | (L311) |
| 57 | 333.64919 | −1.0000 | | |
| 58 | ∞ | −1.0000 | | (AS) |
| 59 | −303.09919 | −68.2244 | 1.5603261 | (L312) |
| 60 | ∞ | −1.0000 | | |
| 61 | −182.25869 | −77.6122 | 1.5603261 | (L313) |
| 62* | −472.72383 | −1.0000 | | |
| 63 | −131.14200 | −49.9999 | 1.5603261 | (L314) |
| 64* | −414.78286 | −1.0000 | | |
| 65 | −75.90800 | −43.3351 | 1.5603261 | (L315: Lb) |
| 66 | ∞ | −1.0000 | 1.435876 | (Lm2) |
| 67 | ∞ | −13.0000 | 1.5603261 | (Lp) |
| 68 | ∞ | −2.9999 | 1.435876 | (Lm1) |
| (Wafer Surface) | | | | |

Figure 5:
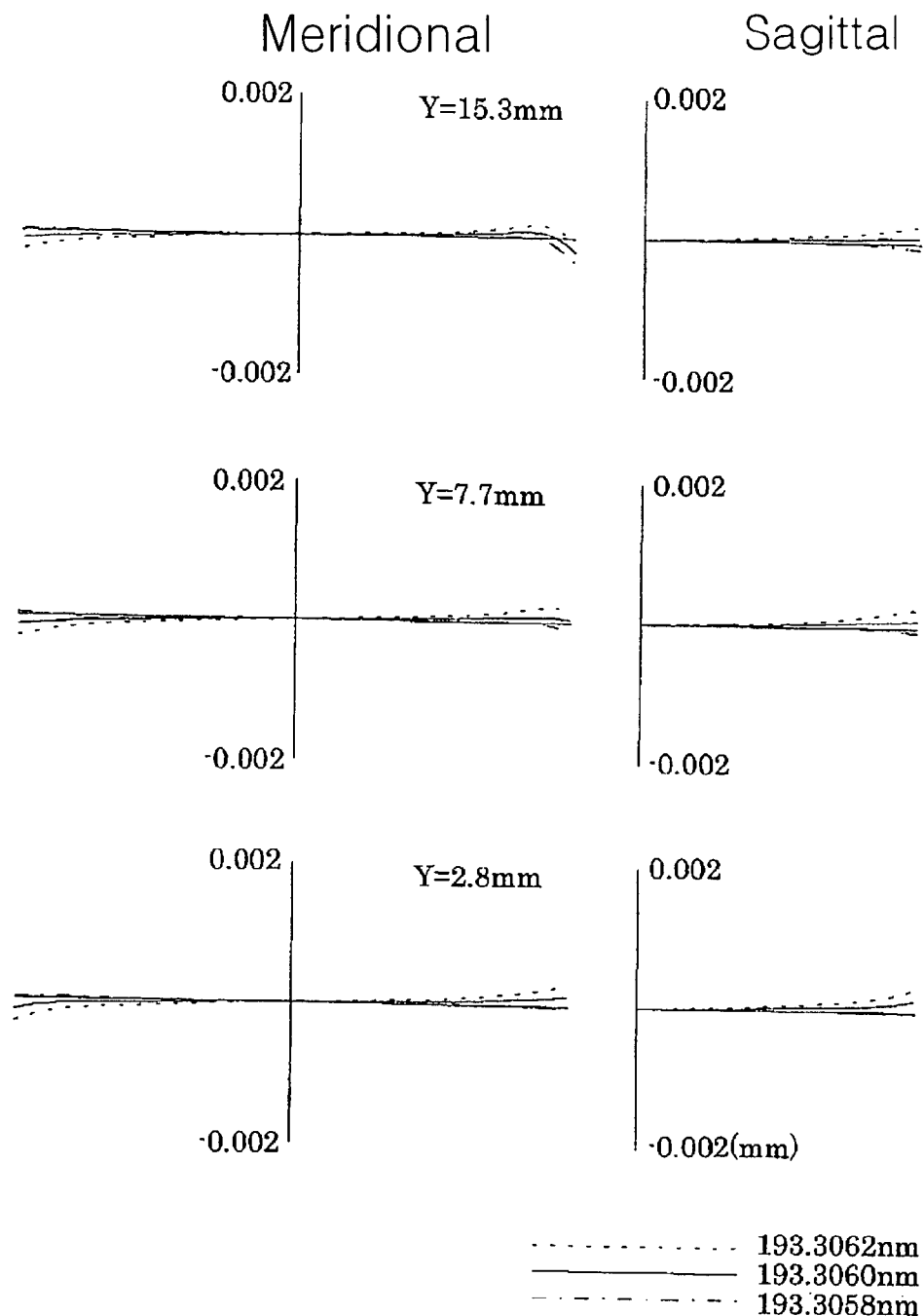
FIG. 5 shows lateral aberration occurring in the projection optical system in the first example of the present embodiment.

(Aspherical Surface Data)
9th surface $\kappa = 0$
$C_4 = -7.9031*10^{-8}$   $C_6 = 8.6709*10^{-12}$
$C_8 = -6.5472*10^{-16}$   $C_{10} = 1.5504*10^{-20}$
$C_{12} = 2.6800*10^{-24}$   $C_{14} = -2.6032*10^{-28}$
$C_{16} = 7.3308*10^{-33}$   $C_{18} = 0$ 17th surface $\kappa = 0$
$C_4 = 4.7672*10^{-9}$   $C_6 = -8.7145*10^{-13}$
$C_8 = -2.8591*10^{-17}$   $C_{10} = 3.9981*10^{-21}$
$C_{12} = -1.9927*10^{-25}$   $C_{14} = 2.8410*10^{-30}$
$C_{16} = 6.5538*10^{-35}$   $C_{18} = 0$ 24th surface $\kappa = 0$
$C_4 = 2.7118*10^{-8}$   $C_6 = -4.0362*10^{-13}$
$C_8 = 8.5346*10^{-18}$   $C_{10} = -1.7653*10^{-22}$
$C_{12} = -1.1856*10^{-27}$   $C_{14} = 5.2597*10^{-31}$
$C_{16} = -2.0897*10^{-35}$   $C_{18} = 0$ 43rd surface $\kappa = 0$
$C_4 = -1.8839*10^{-8}$   $C_6 = 5.6009*10^{-13}$
$C_8 = -1.8306*10^{-17}$   $C_{10} = 2.2177*10^{-21}$
$C_{12} = -2.3512*10^{-25}$   $C_{14} = 1.7766*10^{-29}$
$C_{16} = -6.5390*10^{-34}$   $C_{18} = 0$ 47th surface $\kappa = 0$
$C_4 = 9.0773*10^{-8}$   $C_6 = -5.4651*10^{-12}$
$C_8 = 4.4000*10^{-16}$   $C_{10} = -2.7426*10^{-20}$
$C_{12} = 3.2149*10^{-25}$   $C_{14} = 2.3641*10^{-28}$
$C_{16} = -1.3953*10^{-32}$   $C_{18} = 0$ 48th surface $\kappa = 0$
$C_4 = 3.0443*10^{-8}$   $C_6 = -1.6528*10^{-12}$
$C_8 = 2.3949*10^{-17}$   $C_{10} = -4.4953*10^{-21}$
$C_{12} = 3.0165*10^{-25}$   $C_{14} = -1.2463*10^{-28}$
$C_{16} = 1.0783*10^{-32}$   $C_{18} = 0$ 51st surface $\kappa = 0$
$C_4 = 1.8357*10^{-8}$   $C_6 = -4.3103*10^{-13}$
$C_8 = -9.4499*10^{-17}$   $C_{10} = 4.3247*10^{-21}$
$C_{12} = -1.6979*10^{-25}$   $C_{14} = 8.6892*10^{-30}$
$C_{16} = -1.5935*10^{-34}$   $C_{18} = 0$ 53th surface $\kappa = 0$
$C_4 = -3.9000*10^{-8}$   $C_6 = -7.2737*10^{-13}$
$C_8 = 1.1921*10^{-16}$   $C_{10} = -2.6393*10^{-21}$
$C_{12} = -3.1544*10^{-26}$   $C_{14} = 1.8774*10^{-30}$
$C_{16} = -2.3545*10^{-35}$   $C_{18} = 0$ 54th surface $\kappa = 0$
$C_4 = 1.9116*10^{-8}$   $C_6 = -6.7783*10^{-13}$
$C_8 = 1.5688*10^{-17}$   $C_{10} = -6.0850*10^{-22}$
$C_{12} = 1.8575*10^{-26}$   $C_{14} = -4.2147*10^{-31}$
$C_{16} = 7.3240*10^{-36}$   $C_{18} = 0$ 62th surface $\kappa = 0$
$C_4 = 3.0649*10^{-8}$   $C_6 = -2.3613*10^{-12}$
$C_8 = 1.5604*10^{-16}$   $C_{10} = -7.3591*10^{-21}$
$C_{12} = 2.1593*10^{-25}$   $C_{14} = -3.5918*10^{-30}$
$C_{16} = 2.5879*10^{-35}$   $C_{18} = 0$ 64th surface $\kappa = 0$
$C_4 = -6.0849*10^{-8}$   $C_6 = -8.7021*10^{-13}$
$C_8 = -1.5623*10^{-16}$   $C_{10} = 1.5681*10^{-20}$
$C_{12} = -1.6989*10^{-24}$   $C_{14} = 7.9711*10^{-29}$
$C_{16} = -2.7075*10^{-33}$   $C_{18} = 0$ FIG. 5 shows lateral aberrations in the projection optical system PL of the first example. In the aberration charts, Y represents the image height, the solid line represents lateral aberration occurring when the exposure beam has a central wavelength of 193.3060 nm, the broken line represents lateral aberration occurring when the exposure beam has a central wavelength of 193.306 nm+0.2 pm=193.3062 nm, the single-dash line represents lateral aberration occurring when the exposure beam has a central wavelength of 193.306 nm−0.2 pm=193.3058 nm. The notations used in FIG. 5 are used in FIG. 7, which will be described later. As apparent from FIG. 5, the aberration is corrected in a satisfactory manner for the exposure beams with a wavelength width of 193.306 nm±0.2 pm although the projection optical system PL has an extremely large image-side numerical aperture (NA=1.32) and a relatively large effective exposure region ER (26 mm by 5 mm).

SECOND EXAMPLE

Figure 6:
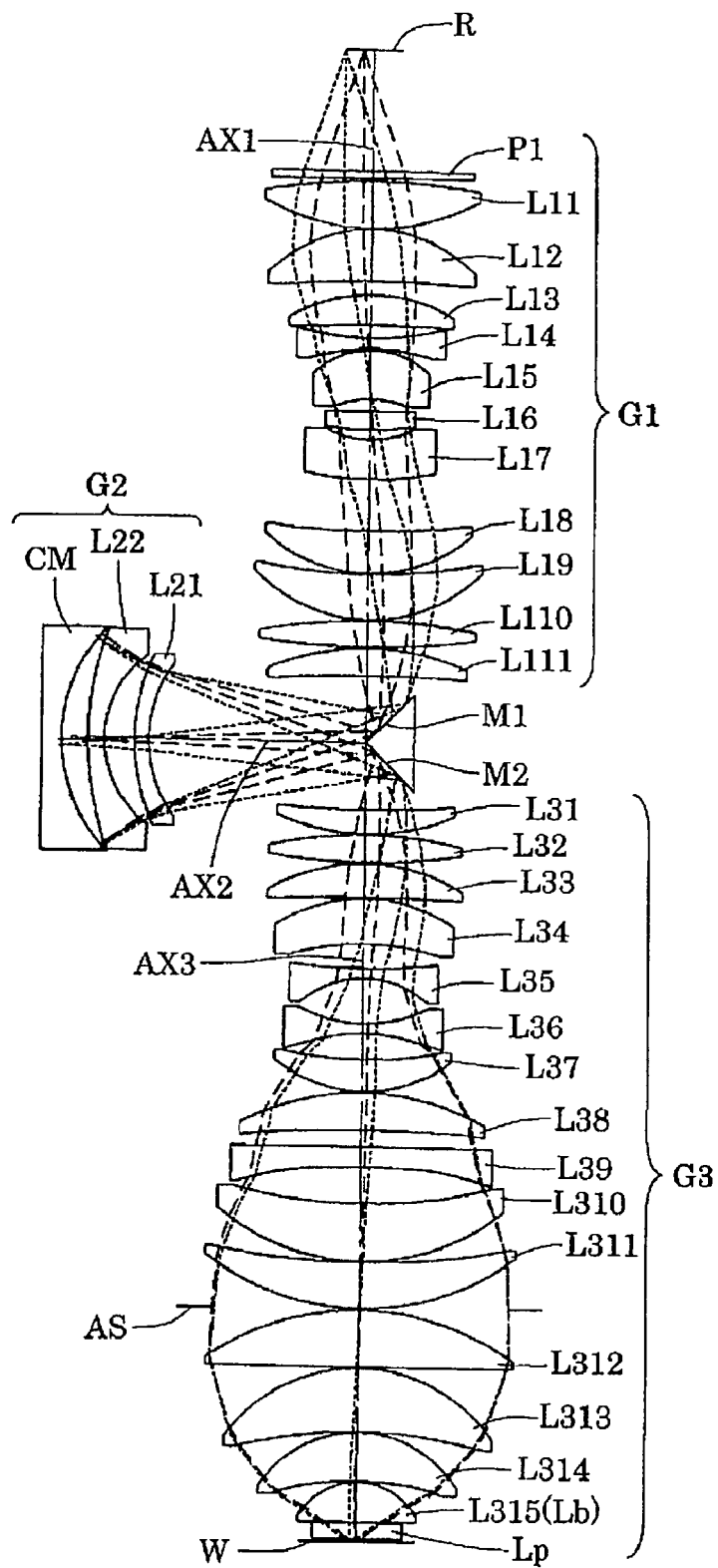
FIG. 6 shows a lens structure of a projection optical system in a second example of the present embodiment.

FIG. 6 shows a lens structure for a projection optical system according to a second example of the present embodiment. As shown in FIG. 6, the first imaging optical system G1 in the projection optical system PL of the second example includes a plane parallel plate P1, a biconvex lens L11, a positive meniscus lens L12 having a convex surface at its reticle side, a positive meniscus lens L13 having a convex surface at its reticle side, a biconcave lens L14 having an aspherical concave surface at its reticle side, a positive meniscus lens L15 having a convex surface at its reticle side, a positive meniscus lens L16 having a concave surface at its reticle side, a negative meniscus lens L17 having a concave surface at its reticle side, a positive meniscus lens L18 having an aspherical concave surface at its reticle side, a positive meniscus lens L19 having a concave surface at its reticle side, a biconcave lens L110, and a positive meniscus lens L111 having an aspherical concave surface at its wafer side, which are arranged sequentially in this order from the reticle side.

The second imaging optical system G2 includes a negative meniscus lens L21 having a concave surface at its reticle side, a negative meniscus lens L22 having a concave surface at its reticle side, and a concave reflective mirror CM having a concave surface at its reticle side, which are arranged sequentially in this order along a traveling path of the incoming light from the reticle side (light entering side) of the projection optical system PL. A third imaging optical system G3 includes a positive meniscus lens L31 having a concave surface at its reticle side, a biconvex lens L32, a positive meniscus lens L33 having a convex surface at its reticle side, a positive meniscus lens L34 having an aspherical concave surface at its wafer side, a biconcave lens L35, a biconcave lens L36 having an aspherical concave surface at its wafer side, a positive meniscus lens L37 having an aspherical concave surface at its reticle side, a positive meniscus lens L38 having an aspherical concave surface at its wafer side, a plano-concave lens L39 having an aspherical concave surface at its wafer side, a positive meniscus lens L310 having an aspherical concave surface at its reticle side, a positive meniscus lens L311 having a concave surface at its reticle side, an aperture stop AS, a plano-convex lens L312 having a planar surface at its wafer side, a positive meniscus lens L313 having an aspherical concave surface at its wafer side, a positive meniscus lens S314 having an aspherical concave surface at its wafer side, a plano-convex lens L315 (interface lens Lb) having a planar surface at its wafer side, and a plane parallel plate Lp, which are arranged sequentially in this order from the reticle side (light entering side).

In the same manner as in the first example, in the second example, an optical path between the interface lens Lb and the plane parallel plate (immersed plane parallel plate) Lp and an optical path between the plane parallel plate Lp and the wafer W are filled with pure water (Lm1 and Lm2) having a refractive index of 1.435876 relative to an ArF excimer laser beam (having a central wavelength λ of 193.306 nm), which is the used laser beam (exposure beam). All the light transmitting members including the interface lens Lb and the plane parallel plate Lp are made of silica ($SiO_2$), which has a refractive index of 1.5603261 relative to the central wavelength of the used light. Table 2 below shows the specifications of the projection optical system PL according to the second example.

TABLE 2

(Main Specifications)
λ = 193.306 nm
β = ¼
NA = 1.3
B = 15.4 mm
A = 3 mm
LX = 26 mm
LY = 5 mm (Specifications of Optical Members)

| Surface No. | r | d | n | Optical Member |
|---|---|---|---|---|
|  | (Reticle Surface) | 128.0298 |  |  |
| 1 | ∞ | 8.0000 | 1.5603261 | (P1) |
| 2 | ∞ | 3.0000 |  |  |
| 3 | 708.58305 | 50.0000 | 1.5603261 | (L11) |
| 4 | −240.96139 | 1.0000 |  |  |
| 5 | 159.28256 | 55.0000 | 1.5603261 | (L12) |
| 6 | 1030.42583 | 15.3309 |  |  |
| 7 | 175.91680 | 33.4262 | 1.5603261 | (L13) |
| 8 | 1901.42936 | 13.4484 |  |  |
| 9* | −313.76486 | 11.8818 | 1.5603261 | (L14) |
| 10 | 235.56199 | 1.0000 |  |  |
| 11 | 90.40801 | 53.3442 | 1.5603261 | (L15) |
| 12 | 109.36394 | 12.8872 |  |  |
| 13 | −1337.13410 | 20.2385 | 1.5603261 | (L16) |
| 14 | −314.47144 | 10.2263 |  |  |

TABLE 2-continued (Main Specifications)
λ = 193.306 nm
β = ¼
NA = 1.3
B = 15.4 mm
A = 3 mm
LX = 26 mm
LY = 5 mm

| 15 | −106.13528 | 42.5002 | 1.5603261 | (L17) |
|---|---|---|---|---|
| 16 | −334.97792 | 56.0608 |  |  |
| 17* | −1619.43320 | 46.3634 | 1.5603261 | (L18) |
| 18 | −167.00000 | 1.0000 |  |  |
| 19 | −568.04127 | 48.4966 | 1.5603261 | (L19) |
| 20 | −172.67366 | 1.0000 |  |  |
| 21 | 637.03167 | 27.8478 | 1.5603261 | (L110) |
| 22 | −838.93167 | 1.0000 |  |  |
| 23 | 264.56403 | 30.7549 | 1.5603261 | (L111) |
| 24* | 3443.52617 | 72.0000 |  |  |
| 25 | ∞ | −237.1956 |  | (M1) |
| 26 | 134.07939 | −15.0000 | 1.5603261 | (L21) |
| 27 | 218.66017 | −33.2263 |  |  |
| 28 | 111.51192 | −18.0000 | 1.5603261 | (L22) |
| 29 | 334.92606 | −28.5215 |  |  |
| 30 | 170.92067 | 28.5215 |  | (CM) |
| 31 | 334.92606 | 18.0000 | 1.5603261 | (L22) |
| 32 | 111.51192 | 33.2263 |  |  |
| 33 | 218.66017 | 15.0000 | 1.5603261 | (L21) |
| 34 | 134.07939 | 237.1956 |  |  |
| 35 | ∞ | −72.0000 |  | (M2) |
| 36 | 1133.17643 | −25.2553 | 1.5603261 | (L31) |
| 37 | 247.47802 | −1.0000 |  |  |
| 38 | −480.60890 | −29.6988 | 1.5603261 | (L32) |
| 39 | 626.43077 | −1.0000 |  |  |
| 40 | −208.29831 | −36.2604 | 1.5603261 | (L33) |
| 41 | −2556.24930 | −1.0000 |  |  |
| 42 | −173.46230 | −50.0000 | 1.5603261 | (L34) |
| 43* | −294.18687 | −26.4318 |  |  |
| 44 | 699.54032 | −11.5000 | 1.5603261 | (L35) |
| 45 | −106.38847 | −47.9520 |  |  |
| 46 | 158.19938 | −11.5000 | 1.5603261 | (L36) |
| 47* | −189.99848 | −27.6024 |  |  |
| 48* | 487.32943 | −34.3282 | 1.5603261 | (L37) |
| 49 | 153.21216 | −1.0000 |  |  |
| 50 | −280.33475 | −39.4036 | 1.5603261 | (L38) |
| 51* | −1666.66667 | −17.3862 |  |  |
| 52 | ∞ | −22.0000 | 1.5603261 | (L39) |
| 53* | −1511.71580 | −40.3150 |  |  |
| 54* | 655.86673 | −62.2198 | 1.5603261 | (L310) |
| 55 | 242.88510 | −1.0000 |  |  |
| 56 | 843.73059 | −49.2538 | 1.5603261 | (L311) |
| 57 | 280.00000 | −1.0000 |  |  |
| 58 | ∞ | −1.0000 |  | (AS) |
| 59 | −291.92686 | −61.1038 | 1.5603261 | (L312) |
| 60 | ∞ | −1.0000 |  |  |
| 61 | −179.32463 | −67.4474 | 1.5603261 | (L313) |
| 62* | −438.34656 | −1.0000 |  |  |
| 63 | −128.42402 | −52.4156 | 1.5603261 | (L314) |
| 64* | −401.88080 | −1.0000 |  |  |
| 65 | −75.86112 | −41.5893 | 1.5603261 | (L315: Lb) |
| 66 | ∞ | −1.0000 | 1.435876 | (Lm2) |
| 67 | ∞ | −16.5000 | 1.5603261 | (Lp) |
| 68 | ∞ | −3.0000 | 1.435876 | (Lm1) |
| (Wafer Surface) |  |  |  |  |

(Aspherical Surface Data)

9th surface $\kappa = 0$
$C_4 = -3.1753 * 10^{-8}$     $C_6 = 9.0461 * 10^{-12}$
$C_8 = -1.0355 * 10^{-15}$    $C_{10} = 1.2398 * 10^{-19}$
$C_{12} = -1.1221 * 10^{-23}$   $C_{14} = 5.7476 * 10^{-28}$
$C_{16} = -1.1800 * 10^{-32}$   $C_{18} = 0$ 17th surface $\kappa = 0$
$C_4 = -2.8399 * 10^{-8}$     $C_6 = -3.0401 * 10^{-13}$
$C_8 = 1.1462 * 10^{-17}$     $C_{10} = 4.0639 * 10^{-22}$

TABLE 2-continued (Main Specifications)
$\lambda = 193.306$ nm
$\beta = ¼$
NA = 1.3
B = 15.4 mm
A = 3 mm
LX = 26 mm
LY = 5 mm

| | |
|---|---|
| $C_{12} = -8.6125*10^{-26}$ | $C_{14} = 4.4202*10^{-30}$ |
| $C_{16} = -9.9158*10^{-35}$ | $C_{18} = 0$ |

24th surface

| | |
|---|---|
| $\kappa = 0$ | |
| $C_4 = 2.1499*10^{-8}$ | $C_6 = -3.8861*10^{-13}$ |
| $C_8 = 5.4812*10^{-18}$ | $C_{10} = -2.1623*10^{-23}$ |
| $C_{12} = -2.5636*10^{-26}$ | $C_{14} = 2.1879*10^{-30}$ |
| $C_{16} = -6.5039*10^{-35}$ | $C_{18} = 0$ |

43th surface

| | |
|---|---|
| $\kappa = 0$ | |
| $C_4 = -2.0533*10^{-8}$ | $C_6 = 7.8051*10^{-13}$ |
| $C_8 = 9.4002*10^{-18}$ | $C_{10} = -2.1043*10^{-21}$ |
| $C_{12} = 7.8182*10^{-25}$ | $C_{14} = -9.2007*10^{-29}$ |
| $C_{16} = 3.6742*10^{-33}$ | $C_{18} = 0$ |

47th surface

| | |
|---|---|
| $\kappa = 0$ | |
| $C_4 = 9.8639*10^{-8}$ | $C_6 = -6.7359*10^{-12}$ |
| $C_8 = 6.8579*10^{-16}$ | $C_{10} = -6.1604*10^{-20}$ |
| $C_{12} = 5.1722*10^{-24}$ | $C_{14} = -2.9412*10^{-28}$ |
| $C_{16} = 8.6688*10^{-33}$ | $C_{18} = 0$ |

48th surface

| | |
|---|---|
| $\kappa = 0$ | |
| $C_4 = 4.3101*10^{-8}$ | $C_6 = -3.2805*10^{-12}$ |
| $C_8 = 5.6432*10^{-17}$ | $C_{10} = -9.2345*10^{-22}$ |
| $C_{12} = 1.0713*10^{-25}$ | $C_{14} = -9.9944*10^{-30}$ |
| $C_{16} = 1.8148*10^{-33}$ | $C_{18} = 0$ |

51th surface

| | |
|---|---|
| $\kappa = 0$ | |
| $C_4 = 2.5839*10^{-8}$ | $C_6 = -1.8848*10^{-12}$ |
| $C_8 = -4.9271*10^{-17}$ | $C_{10} = 4.4946*10^{-21}$ |
| $C_{12} = -7.2550*10^{-26}$ | $C_{14} = 4.9237*10^{-31}$ |
| $C_{16} = -2.4260*10^{-35}$ | $C_{18} = 6.2565*10^{-40}$ |

53th surface

| | |
|---|---|
| $\kappa = 0$ | |
| $C_4 = -4.7449*10^{-8}$ | $C_6 = -2.3075*10^{-13}$ |
| $C_8 = 1.0475*10^{-16}$ | $C_{10} = -2.1805*10^{-21}$ |
| $C_{12} = -9.0530*10^{-26}$ | $C_{14} = 4.6274*10^{-30}$ |
| $C_{16} = -6.4961*10^{-35}$ | $C_{18} = 3.4402*10^{-41}$ |

54th surface

| | |
|---|---|
| $\kappa = 0$ | |
| $C_4 = 2.0328*10^{-8}$ | $C_5 = -7.7439*10^{-13}$ |
| $C_8 = 1.6217*10^{-17}$ | $C_{10} = -3.5531*10^{-22}$ |
| $C_{12} = 8.2634*10^{-27}$ | $C_{14} = 2.6232*10^{-31}$ |
| $C_{16} = -2.0989*10^{-35}$ | $C_{18} = 4.0888*10^{-40}$ |

62th surface

| | |
|---|---|
| $\kappa = 0$ | |
| $C_4 = 2.5121*10^{-8}$ | $C_6 = -2.0342*10^{-12}$ |
| $C_8 = 1.2906*10^{-16}$ | $C_{10} = -5.4455*10^{-21}$ |
| $C_{12} = 1.2885*10^{-25}$ | $C_{14} = -1.4600*10^{-30}$ |
| $C_{16} = 3.2850*10^{-36}$ | $C_{18} = 0$ |

64th surface

| | |
|---|---|
| $k = 0$ | |
| $C_4 = -2.8098*10^{-8}$ | $C_6 = -3.9565*10^{-12}$ |
| $C_8 = 3.1966*10^{-16}$ | $C_{10} = -2.7246*10^{-20}$ |
| $C_{12} = 1.8266*10^{-24}$ | $C_{14} = -8.6244*10^{-29}$ |
| $C_{16} = 2.1570*10^{-33}$ | $C_{18} = 0$ |

Figure 7:
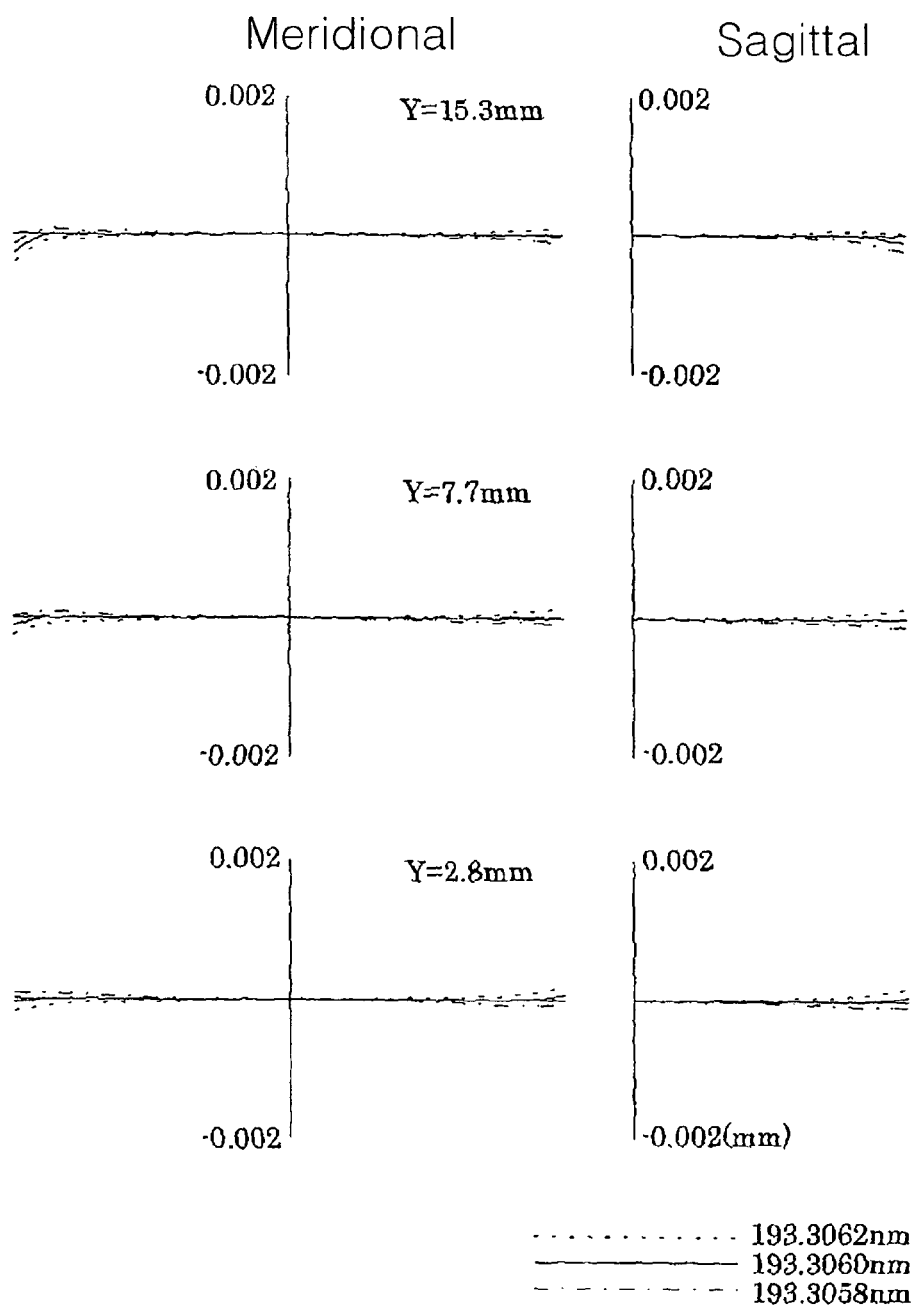
FIG. 7 shows lateral aberration occurring in the projection optical system in the second example of the present embodiment.

FIG. 7 shows lateral aberrations occurring in the projection optical system PL of the second example. As apparent from FIG. 7, the aberration is corrected in an satisfactory manner for the exposure beams having a wavelength width of 193.306 nm±0.2 pm even though the projection optical system PL of the second example has an extremely large image-side numerical aperture (NA=1.3) and a relatively large effective exposure region ER (26 mm by 5 mm) in the same manner as in the projection optical system PL of the first example.

In this manner, the optical path formed between the interface lens Lb and the wafer W is filled with pure water (Lm1 and Lm2) having a large refractive index in the projection optical system PL of the present embodiment. This enables the projection optical system PL to have a relatively large effective imaging region while achieving a large effective image-side numerical aperture. The projection optical system PL of each example of the present invention has a rectangular effective exposure region (stationary exposure region) ER having the dimensions of 26 mm by 5 mm while achieving a high image-side numerical aperture of about 1.3 for an ArF excimer laser beam having a central wavelength of 193.306 nm. This enables the projection optical system PL of each example to scan and expose a circuit pattern within a rectangular exposure region of, for example, 26 mm by 33 mm with a high accuracy.

Figure 8A:
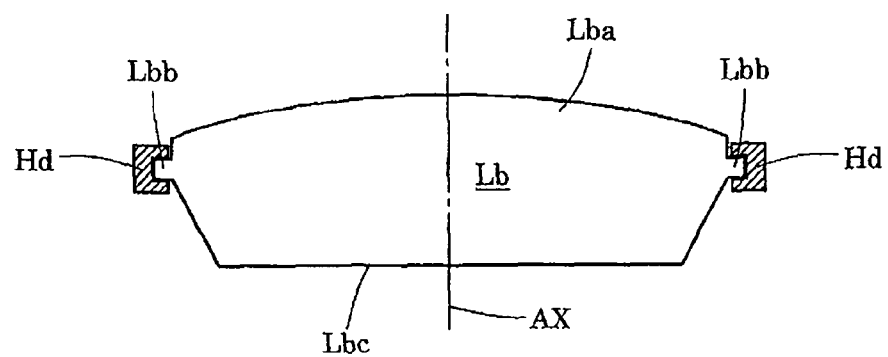
FIG. 8 is a diagram illustrating a problem that occurs when setting a large image-side numerical aperture for an immersion projection optical system.

When the image-side numerical aperture of the immersion projection optical system is, for example, less than 1.2, as shown in FIG. 8(a), reflection of incident light at a light entering surface Lba can be avoided even if the curvature of convex light receiving surface Lba of the interface lens Lb is not that large. As a result, a holding tab Lbb for holding the interface lens Lb may sufficiently be spaced from liquid (immersion liquid, not shown) at the side of a light emitting surface Lbc. This lowers the risk of liquid entering the space between the holding tab Lbb and a hold Hd in the lens cell and liquid leaking into the projection optical system.

Figure 8B:
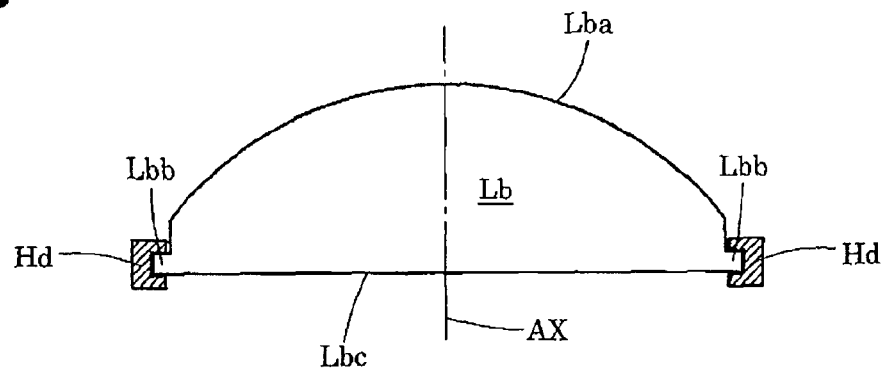

However, when setting the image-side numerical aperture of the immersion projection optical system to be greater than, for example, 1.2, as shown in FIG. 8(b), to avoid reflection of incident light to the light entering surface Lba of the interface lens Lb, the light entering surface Lba must have a convex shape with a significantly large curvature. In this case, the holding tab Lbb for the interface lens Lb is inevitably located near the liquid at the side of the light emitting surface Lbc, and liquid is apt to easily leaking into the space between the holding tab Lbb and the hold Hd and further into the projection optical system.

When liquid leaks into the space between the holding tab Lbb and the hold Hd, the leaking liquid acts to produce a force that attracts the holding tab Lbb and the hold Hd toward each other. This may move or deform the interface lens Lb and increase the risk of the imaging capability of the projection optical system being lowered. Further, when liquid passes through the holding lens Lbb and the hold Hd and leaks into the projection optical system, the anti-reflection film formed on the optical surface of a light transmission member, which includes the interface lens Lb, may be deteriorated thereby increasing the risk of the imaging capability of the projection optical system being lowered.

Figure 9A:
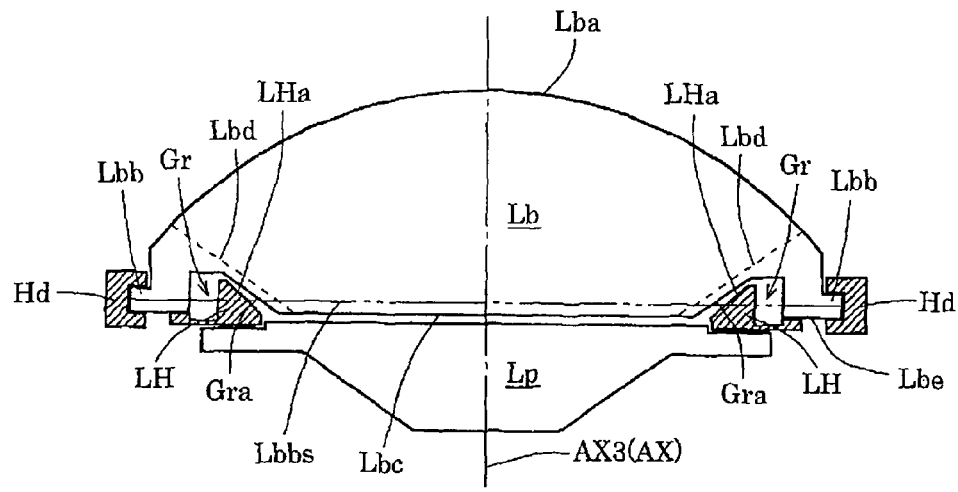
FIG. 9 is a schematic diagram showing the main features of the projection optical system of the present embodiment.

FIG. 9 is a schematic diagram showing the main feature of the projection optical system in the present embodiment. Referring to FIG. 9(a), in the projection optical system PL of the present embodiment, a groove Gr (that is, a space) is formed so as to surround an effective region (region through which effective light beam passes) of the light emitting surface Lbc of the interface lens (interface optical element) Lb. The groove Gr is, for example, continuously formed so as to entirely surround the effective region of the light emitting surface Lbc and includes an inclined surface Gra that is in accordance with the effective circumferential surface Lbd (for example, substantially parallel to an effective circumferential surface Lbd) connecting the circumference of the effective region of the light entering surface Lba to the effective region of the light emitting surface Lbc.

In the projection optical system PL, the image-side numerical aperture of the immersion projection optical system is to be substantially greater than, for example, 1.2 (1.32 or 1.3). Thus, the light entering surface Lba of the interface lens Lb has a large curvature, and the holding tab Lbb is located near liquid Lm2 (not shown) at the side of the light emitting surface Lbc. However, the groove Gr extends deeper than the holding tab Lbb to be closer to the light entering surface Lba. In other words, the holding tab Lbb is arranged on a holding plane Lbbs (hypothetical plane shown by double-dashed line in the drawing), which is orthogonal to the optical axis AX. Space, or the interior of the groove Gr, is formed between the holding tab Lbb and the optical axis AX. In this specification, "groove" is a broad concept including a recess and gouged out portions. For example, a step may be formed between the level of the inner surface of the groove Gr (light emitting surface Lbc) and the level of an outer surface Lbe.

In the projection optical system PL of the present embodiment, a liquid holding mechanism LH for holding the liquid Lm2 is arranged between the effective region of the light emitting surface Lbc of the interface lens Lb and the immersed plane parallel plate Lp. The liquid holding mechanism LH is formed from, for example, titanium or stainless steel, and partially projects into the interior (i.e., space) of the groove Gr. More specifically, the liquid holding mechanism LH has an opposed surface LHa, which is spaced from and opposed toward the inclined surface Gra of the groove Gr. A water repellant treatment is performed on at least either one of the inclined surface Gra and the opposed surface LHa. Alternatively, a water repellant film is formed on at least either one of the inclined surface Gra and the opposed surface LHa.

As described above, in the projection optical system PL of the preferred embodiment, the light entering surface Lba of the interface lens Lb has a large curvature. Thus, the holding tab Lbb is located near the liquid Lm2 at the side of the light emitting surface Lbc. However, the groove Gr is formed so as to surround the effective region of the light emitting surface Lbc. Therefore, even when the liquid holding mechanism LH is not used, the groove Gr functions to resist leakage of the liquid Lm2 into the space between the holding tab Lbb and the hold Hd of the lens cell and further into the projection optical system PL.

That is, in the projection optical system PL of the present embodiment, the leakage of liquid (immersion liquid) into the optical system is prevented and a satisfactory imaging capability is maintained. Further, the exposure apparatus of the present embodiment uses the high resolution immersion projection optical system PL, which prevents liquid from entering into the optical system and maintains satisfactory capability. Thus, micropatterns may stably be projected and exposed with high accuracy.

A plurality of unconnected grooves Gr may be formed so as to surround, for example, the effective region of the light emitting surface Lbc of the interface lens Lb. However, to effectively prevent the liquid Lm2 from reaching the holding tab Lbb, as described above, it is preferred that the groove Gr be formed continuously so as to surround the entire effective region of the light emitting surface Lbc and that the groove Gr be formed to extend deeper than the holding tab Lbb to the side of the light entering surface Lba.

In the projection optical system PL of the present embodiment, the plane parallel plate (generally an optical member that has substantially no refractive power) Lp is arranged in the optical path between the interface lens Lb and the wafer W. Thus, even when pure water, which serves as the immersion liquid, is contaminated by out gas or the like due to the photoresist applied to the wafer W, the plane parallel plate Lp arranged between the interface lens Lb and the wafer W functions to effectively prevent the image side optical surface of the interface lens Lb from being contaminated by the contaminated water. Further, the refractive rate difference between the liquid (pure water: Lm1 and Lm2) is small. This significantly moderates the orientation and positional accuracy required for the plane parallel plate Lp. Thus, even when the plane parallel plate Lp is contaminated, the optical capability may be recovered by replacing parts whenever necessary. Further, the plane parallel plate Lp functions to reduce pressure fluctuations of the liquid Lm2, which contacts the interface lens Lb, during scanning and exposure or during a step movement. Thus, liquid may be held in a relatively small space.

In the projection optical system PL of the present embodiment, the liquid holding mechanism LH partially projects into the groove Gr so as to avoid contact with the interface lens Lb, that is, so as to prevent external force from acting on the interface lens Lb. This ensures that the liquid Lm2 is held in the optical path between the effective region of the light emitting surface Lbc of the interface lens Lb and the plane parallel plate Lp. However, when a pressure fluctuation that is greater than predicted occurs in the liquid Lm2, which contacts the interface lens Lb, the liquid Lm2 may be transmitted to the holding tab Lbb through the space between the inclined surface Gra of the groove Gr and the opposed surface LHa of the liquid holding mechanism LH.

Accordingly, it is preferable that a water repellent treatment be performed on at least either one of the hydrophilic inclined surface Gra and the opposed surface LHa or that a water repellent film be applied to at least either one of the inclined surface Gra and the opposed surface LHa so that the liquid Lm2 is not transmitted to the holding tab Lbb through the space between the inclined surface Gra and the opposed surface LHa even when a pressure fluctuation that is greater than predicted occurs in the liquid Lm2, which is in contact with the interface lens Lb. It is preferred that the groove Gr have the inclined surface Gra that is in accordance with the effective circumferential surface Lbd (has an inclination corresponding to the effective circumferential surface Lbd) connecting the circumference of the effective region of the light entering surface Lba to the effective region of the light emitting surface Lbc in order to ensure space for the arrangement of the liquid holding mechanism LH.

In the projection optical system PL of the present embodiment, the effective range in the light emitting surface Lbc of the interface lens Lbc is planar. Thus, the layer of the liquid Lm2 between the interface lens Lb and the plane parallel plate Lp has a uniform thickness. This prevents luminance differences in the exposure region on the wafer W even when the transmissivity of the liquid Lm2 with respect to exposure light is insufficient.

Figure 9B:
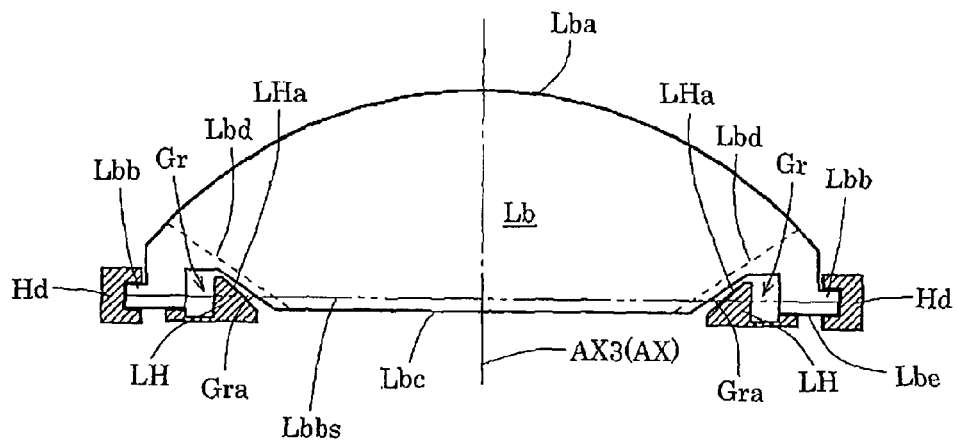

In the above embodiment, the plane parallel plate Lp is arranged in the optical path between the interface lens Lb and the wafer W. However, the present invention is not limited in such a manner and, as shown in the modification of FIG. 9(b), the plane parallel plate Lp may be eliminated. The same advantages as the present embodiment may be obtained with the modification of FIG. 9(b) by forming the groove Gr (that is, a space) so as to surround the effective region in the light emitting surface Lbc of the interface lens Lb.

In the above embodiment, the pure water (Lm1 and Lm2) is filled in the optical path between the interface lens Lb and the wafer W. A liquid having a refractive index higher than the pure water (e.g., a liquid having a refractive index of 1.6 or more) may be used instead. Examples of such high-refractive index liquids include glycenol ($CH_2[OH]CH[OH]CH_2[OH]$) and heptane ($C_7H_{16}$). Further, water containing $H^+$, $Cs^-$, $K^+$, $Cl^-$, $SO_4^{2-}$, or $PO_4^{2-}$, water containing particles of oxide of aluminum, isopropanol, hexane, and decane may also be used.

When such a high-refractive index liquid is used, it is preferable that some of the lenses in the projection optical system PL, in particular, lenses near the image surface (to the wafer W), be formed from a material having a high refractive index. It is preferable that calcium oxide, magnesium oxide, barium fluoride, strontium oxide, barium oxide, or a mixed crystal mainly composed of these materials be used as the high-refractive index material.

This realizes a high numerical aperture with a feasible size. When, for example, an ArF excimer laser (having a wavelength of 193 nm) is used, the projection optical system PL achieves a high numerical aperture of about 1.5 or more. When an $F_2$ laser having a wavelength of 157 nm is used as the exposure beam IL, it is preferable to use a liquid enabling transmission of an $F_2$ laser beam, specifically, a fluorinated fluid, such as perfluoropolyalkyether (PFPE), or fluorinated oil as the liquid.

The exposure apparatus of the above embodiment illuminates the reticle (mask) using an illumination apparatus (an illumination process) and exposes a transfer pattern in the mask onto the photosensitive substrate using the projection optical system (an exposure process). Through the illumination and exposure processes, the exposure apparatus manufactures microdevices (semiconductor devices, imaging devices, liquid crystal display devices, or thin-film magnetic heads). A method for manufacturing a microdevice or specifically a semiconductor device through formation of a predetermined circuit pattern on a wafer or the like as a photosensitive substrate using the exposure apparatus of the present embodiment will now be described with reference to a flowchart shown in FIG. 10.

In step S301 in FIG. 10, a metal film is first formed on wafers of a single lot through vapor deposition. In step S302, photoresist is applied to a metal film formed on each wafer of the single lot. In step S303, the exposure apparatus of the present invention is used to sequentially expose and transfer an image of a pattern in a mask onto shot-regions of each wafer in the single lot with the projection optical system. Then, in step S304, the photoresist formed on each wafer of the single lot is developed. In step S305, each wafer of the single lot is etched using the resist pattern formed on the wafer as a mask. This forms a circuit pattern corresponding to the mask pattern in the shot-regions of each wafer.

Afterwards, circuit patterns corresponding to upper layers are formed to complete the semiconductor device or the like. With the semiconductor device manufacturing method described above, a semiconductor device with an extremely fine circuit pattern is produced with high throughput. In steps S301 to S305, metal is deposited on the wafer through vapor deposition, resist is coated on the metal film, and then processes in which the resist is exposed, developed, and etched are performed. Prior to these processes, a silicon oxide film may first be formed on the wafer, and the resist may be coated on the silicon oxide film. Then, the processes in which the resist is exposed, developed, and etched may be performed.

Figure 11:
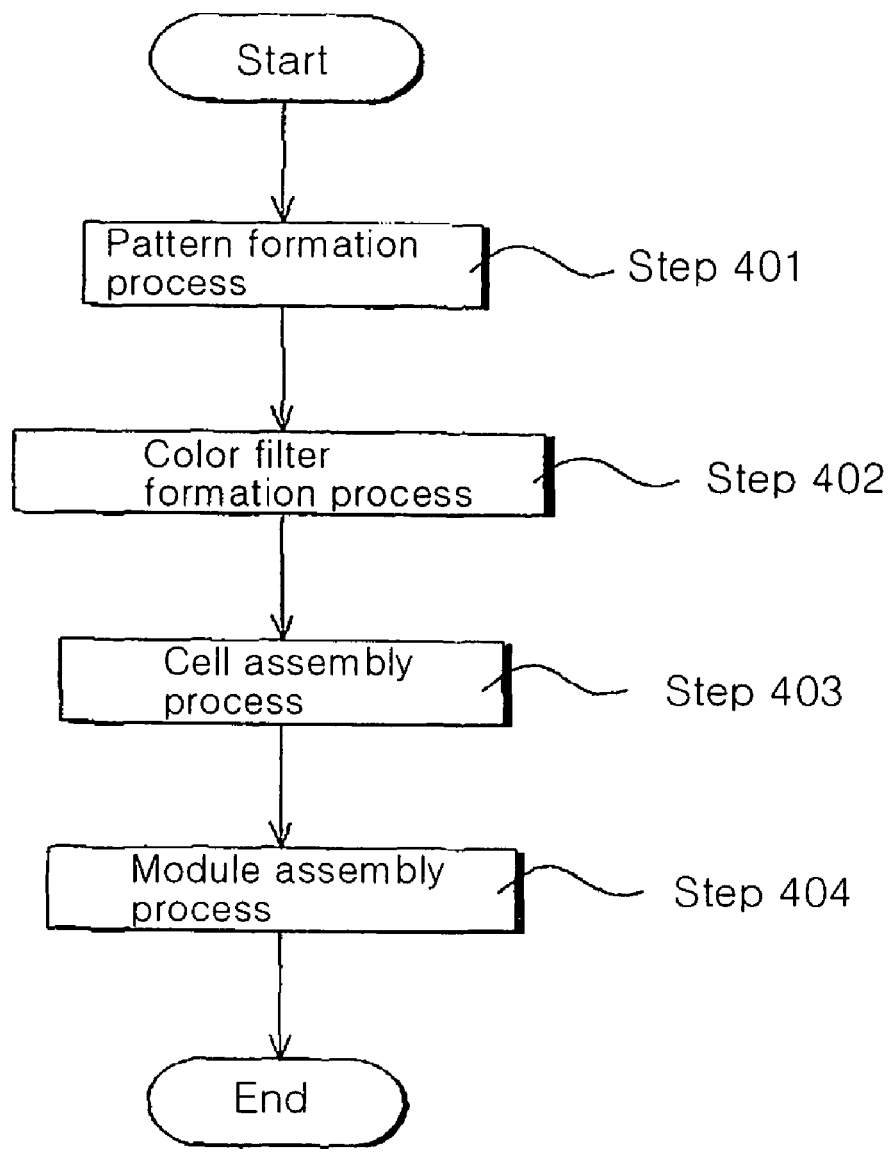
FIG. 11 is a flowchart showing a method for forming a microdevice, which serves as a liquid crystal display device.

The exposure apparatus of the present embodiment may also be used to produce a liquid crystal display device serving as a microdevice by forming a predetermined pattern (a circuit pattern or an electrode pattern) on a plate (glass substrate). One example method for manufacturing a liquid crystal display device will now be described with reference to a flowchart shown in FIG. 11. In FIG. 11, a pattern formation process is performed in step S401. In step S401, a mask pattern is transferred and exposed onto a photosensitive substrate (e.g., a glass substrate coated with resist) using the exposure apparatus of the present embodiment. In other words, a photolithography process is performed. Through the photolithography process, a predetermined pattern including, for example, a large number of electrodes is formed on the photosensitive substrate. Afterwards, a predetermined pattern is formed on the substrate through processes including a developing process, an etching process, and a resist removing process. Then, a color filter formation process is performed in step S402.

In step S402, a color filter is formed by, for example, arranging plural sets of R (red), G (green), and B (blue) dots in a matrix, or arranging plural of sets of filters formed by R, G, and B stripes in horizontal scanning line directions. After the color filter formation process is performed in step S402, a cell assembly process is performed in step S403. In step S403, the substrate having a predetermined pattern obtained through the pattern formation process performed in step S401 and the color filter or the like obtained through the color filter formation process performed in step S402 are assembled together to form the liquid crystal panel (liquid crystal cell).

In S403, for example, a liquid crystal is injected between the substrate having the predetermined pattern obtained through the pattern formation process performed in S401 and the color filter obtained through the color filter formation process performed in S402 to form the liquid crystal panel (liquid crystal cell). In a module assembly process performed subsequently in step S404, an electric circuit for enabling the assembled liquid crystal panel (liquid crystal cell) to perform a display operation and other components including a backlight are mounted. This completes the liquid crystal display device. The liquid crystal display device manufacturing method described above enables a liquid crystal device having an extremely fine circuit pattern to be produced with high throughput.

Although the ArF excimer laser light source is used in the above embodiment, other appropriate light sources, such as an $F_2$ laser light source, may be used. When an $F_2$ laser beam is used as the exposure beam, a fluorinated liquid enabling transmission of an $F_2$ laser beam, such as fluorinated oil or perfluoropolyalkyether (PFPE), is used as the liquid that fills the image space portion.

The present invention is applied to an immersion projection optical system that is mounted on the exposure apparatus in the above embodiment. However, the application of the present invention is not limited to such an optical system. The present invention is also applicable to other typical immersion projection optical systems. Further, in the above embodiment, the present invention is applied to an off-axis catadioptric optical system of which effective field of view does not include the optical axis. However, the application of the present invention is not limited to such an optical system. The present invention is also applicable to other typical projection optical systems. Additionally, in the above embodiment, the present invention is applied to an immersion projection optical system. However, the application of the present invention is not limited to such an optical system. The present invention is also applicable to an immersion objective optical system.

In the above embodiment, the interface lens Lb and the immersed plane parallel plate Lp are formed from silica, which is an amorphous material. However, the material forming the interface lens Lb and the immersed plane parallel plate Lp is not limited to silica. For example, a crystalline material, such as magnesium oxide, calcium oxide, strontium oxide, barium oxide, barium fluoride, barium lithium fluoride (BaLiF$_3$), lutetium aluminum garnet (LuAG), or crystalline magnesium aluminum spinel (MgAl$_2$O$_4$) may be used.

Although pure water is used as the first liquid and the second liquid in the above embodiment, the first and second liquids are not limited to pure water. For example, water containing H$^+$, Cs$^+$, K$^+$, Cl$^-$, SO$_4{}^{2-}$, or PO$_4{}^{2-}$, isopropanol, glycerol, hexane, heptane, decane, Delphi (cyclic hydrocarbon compound) manufactured by Mitusi Chemicals, Inc., HIF-001 manufactured by JSR Corporation, and IF131, IF132, and IF175 manufactured by E. I. du Pont de Nemours and Company may be used as the first and second liquids.

The invention claimed is:

1. An immersion projection optical system for projecting an image of a first plane onto a second plane through a liquid, the immersion projection optical system comprising:
    a first optical element having a first optical surface that contacts the liquid and a second optical surface that faces the first plane, wherein the first optical element includes a held portion contactable with a holding member to hold the first optical element, the held portion being arranged on a holding plane that is orthogonal to an optical axis of the first optical element, the first optical element defining a space thereon, located between the held portion and the optical axis and extending depthwise into the first optical element from the first optical surface, the space extending sufficiently depthwise into the first optical element to cross through the holding plane; and
    a member including a projecting portion that extends, from outside the space, into the space through the holding plane without contacting the first optical element.

2. The immersion projection optical system according to claim 1, wherein the space continuously and entirely surrounds the first optical surface of the first optical element.

3. The immersion projection optical system according to claim 2, wherein the space is bounded in part by an inclined surface of the first optical element that is in accordance with an effective circumferential surface connecting the circumference of an effective region in the second optical surface of the first optical element with the circumference of the effective region in the first optical surface of the first optical element.

4. The immersion projection optical system according to claim 1, wherein the space is bounded in part by an inclined surface of the first optical element that is in accordance with an effective circumferential surface connecting the circumference of an effective region in the second optical surface with the circumference of an effective region in the first optical surface.

5. The immersion projection optical system according to claim 1, further comprising a second optical element, having substantially no refractive power, arranged along the optical axis between the first optical element and the second plane.

6. The immersion projection optical system according to claim 5, wherein:
    the member includes a liquid holding mechanism that holds the liquid in an optical path between the first optical surface of the first optical element and the second optical element, and
    the liquid holding mechanism includes the projecting portion.

7. The immersion projection optical system according to claim 1, wherein:
    the member includes a liquid holding mechanism that holds the liquid in an optical path between the first optical surface of the first optical element and the second plane, and
    the liquid holding mechanism includes the projecting portion.

8. The immersion projection optical system according to claim 6, wherein:
    the space is defined in part by an inclined surface of the first optical element that is in accordance with an effective circumferential surface connecting the circumference of an effective region in the second optical surface and the circumference of an effective region in the first optical surface,
    the liquid holding mechanism includes an opposed surface separated from and conformably opposed to the inclined surface of the space, and
    at least one of the inclined surface and the opposed surface is water-repellant.

9. The immersion projection optical system according to claim 6, wherein:
    the space is defined in part by an inclined surface of the first optical element that is in accordance with an effective circumferential surface connecting the circumference of an effective region in the second optical surface and the circumference of an effective region in the first optical surface,
    the liquid holding mechanism includes an opposed surface separated from and conformably opposed to the inclined surface of the space, and
    at least one of the inclined surface and the opposed surface comprises a water-repellant film.

10. The immersion projection optical system according to claim 1, wherein:
    the first optical element is an interface optical element;
    the first optical surface includes an effective region; and
    the effective region is planar.

11. The immersion projection optical system according to claim 1, wherein the second optical surface of the first optical element includes a convex surface facing toward first plane.

12. The immersion projection optical system according to claim 1, wherein at least the first optical element forms a reduced image of the first plane on the second plan; based on light from the first plane.

13. The immersion projection optical system according to claim 12, further comprising:
    a refractive first imaging optical system that forms a first intermediate image based on light from the first plane;
    a second imaging optical system, including at least one concave reflective mirror, that forms a second intermediate image based on light from the first intermediate image; and
    a refractive third imaging optical system that forms the reduced image on the second plan, based on light from the second intermediate image.

14. The immersion projection optical system according to claim 13, further comprising:
    a first folding mirror arranged in an optical path between the first imaging optical system and the second imaging optical system; and
    a second folding mirror arranged in an optical path between the second imaging optical system and the third imaging optical system.

15. The immersion projection optical system according to claim 1, wherein the first optical element is formed from a crystalline material.

16. The immersion projection optical system according to claim 1, wherein the first optical element is formed from an amorphous material.

17. An exposure apparatus comprising:
- an illumination system for illuminating a pattern set on the first plane; and
- the immersion projection optical system according to claim 1 that forms an image of the pattern onto a photosensitive substrate set on the second plane.

18. An exposure method comprising:
- an illuminating step of illuminating a pattern set on the first plane; and
- an exposure step of projecting and exposing an image of the pattern onto a photosensitive substrate set on the second plane using the immersion projection optical system according to claim 1.

19. A device manufacturing method comprising:
- an exposure step of projecting and exposing an image of a pattern set on the first plane onto a photosensitive substrate set on the second plane using the immersion projection optical system according to claim 1; and
- a development step of developing the photosensitive substrate that has undergone the exposure step.

* * * * *